(12) United States Patent
Yamada et al.

(10) Patent No.: US 6,384,701 B1
(45) Date of Patent: May 7, 2002

(54) MICROWAVE AND MILLIMETER WAVE DEVICE MOUNTED ON A SEMICONDUCTIVE SUBSTRATE AND COMPRISED OF DIFFERENT KINDS OF FUNCTIONAL BLOCKS

(75) Inventors: Atsushi Yamada, Tenri; Eiji Suematsu; Noriko Kakimoto, both of Nara, all of (JP)

(73) Assignee: Sharp Kabushiki Kaisha, Osaka (JP)

( * ) Notice: Subject to any disclaimer, the term of this patent is extended or adjusted under 35 U.S.C. 154(b) by 0 days.

(21) Appl. No.: 09/253,007

(22) Filed: Feb. 19, 1999

(30) Foreign Application Priority Data

Feb. 19, 1998 (JP) .............................. 10-037156
Feb. 17, 1999 (JP) .......................... 11-038922

(51) Int. Cl.⁷ .............................. H01L 23/34
(52) U.S. Cl. ................ 333/247; 257/728; 257/664; 257/778
(58) Field of Search ............. 333/247; 257/728, 257/664, 778

(56) References Cited

U.S. PATENT DOCUMENTS

| | | | |
|---|---|---|---|
| 4,739,448 A | | 4/1988 | Rowe et al. |
| 5,406,125 A | | 4/1995 | Johnson et al. ............. 257/774 |
| 5,528,203 A | * | 6/1996 | Mohwmkel et al. ..... 333/247 X |
| 5,550,518 A | * | 8/1996 | Mohwinkel ............. 333/247 X |
| 5,712,602 A | | 1/1998 | Suematsu |
| 5,796,321 A | * | 8/1998 | Caillat et al. ........... 333/247 X |
| 5,903,239 A | * | 5/1999 | Takahashi et al. ....... 333/247 X |
| 5,977,631 A | * | 11/1999 | Notani ................... 333/247 X |
| 6,060,968 A | * | 5/2000 | Baltus et al. ............... 333/247 |
| 6,181,278 B1 | * | 1/2001 | Kakimoto et al. ....... 333/247 X |

FOREIGN PATENT DOCUMENTS

| | | |
|---|---|---|
| EP | 0627765 A1 | 2/1994 |
| EP | 0634890 A1 | 1/1995 |
| JP | 2538072 | 5/1991 |

OTHER PUBLICATIONS

Leah M. Felton; "High Yield GaAs Flip–Chip MIMICs Lead to Low Cost T/R Modules"; IEEE 1994; pp. 1707–1710.

* cited by examiner

Primary Examiner—Benny Lee

(57) ABSTRACT

A microwave and millimeter wave device includes: a dielectric substrate including at least one signal line, a passive circuit and a first grounding conductor portion which are formed on a surface side of the dielectric substrate; and a semiconductor substrate including a plurality of active elements. The signal line is physically and electrically connected to an input/output terminal of the active element via a metal bump; and the first grounding conductor portion is physically and electrically connected to a grounding terminal of the active element via another metal bump.

6 Claims, 28 Drawing Sheets

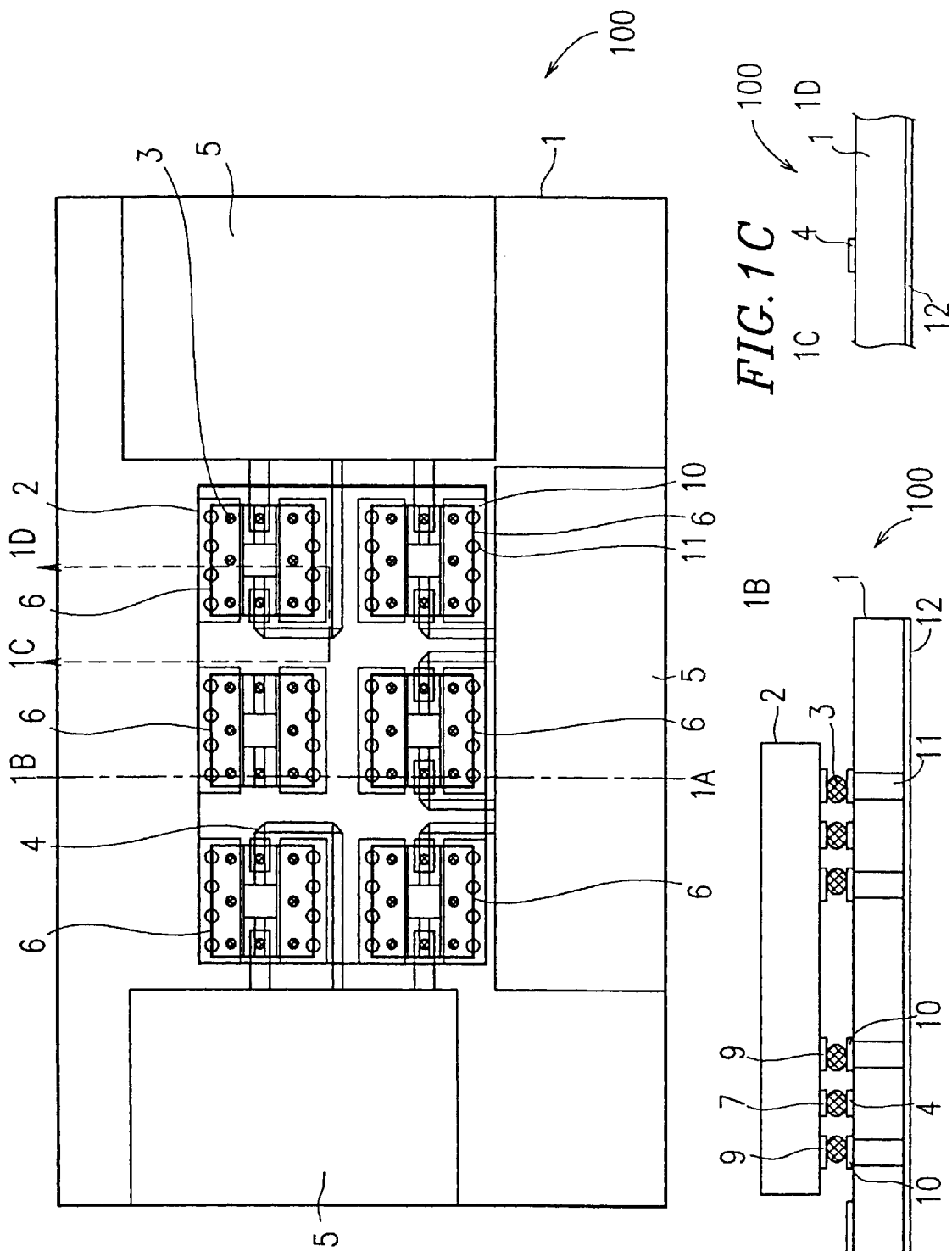
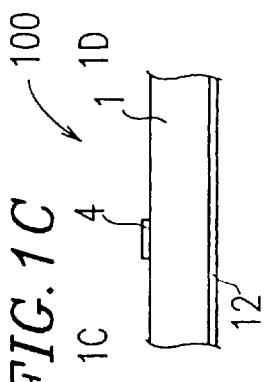
FIG. 1A
FIG. 1B
FIG. 1C

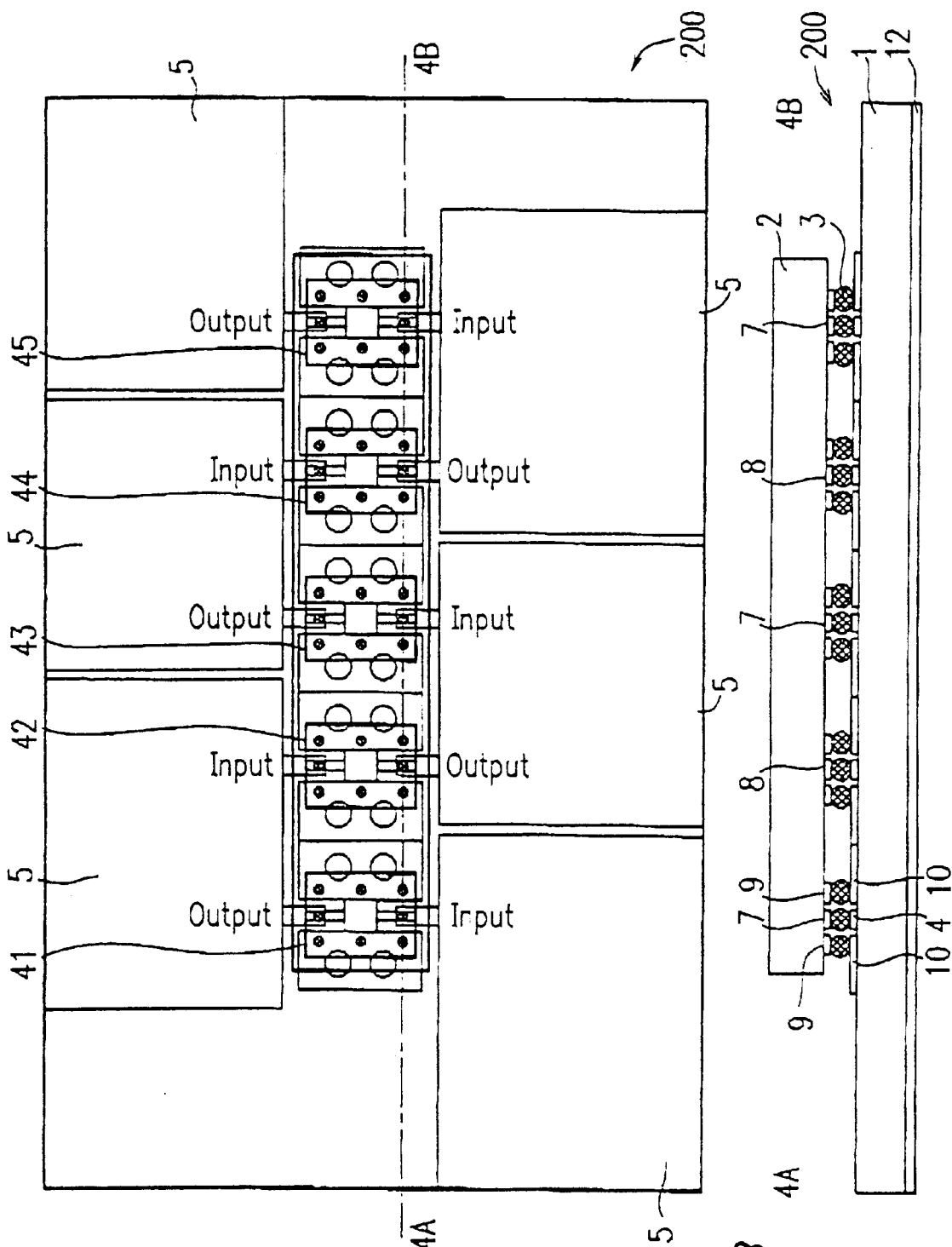

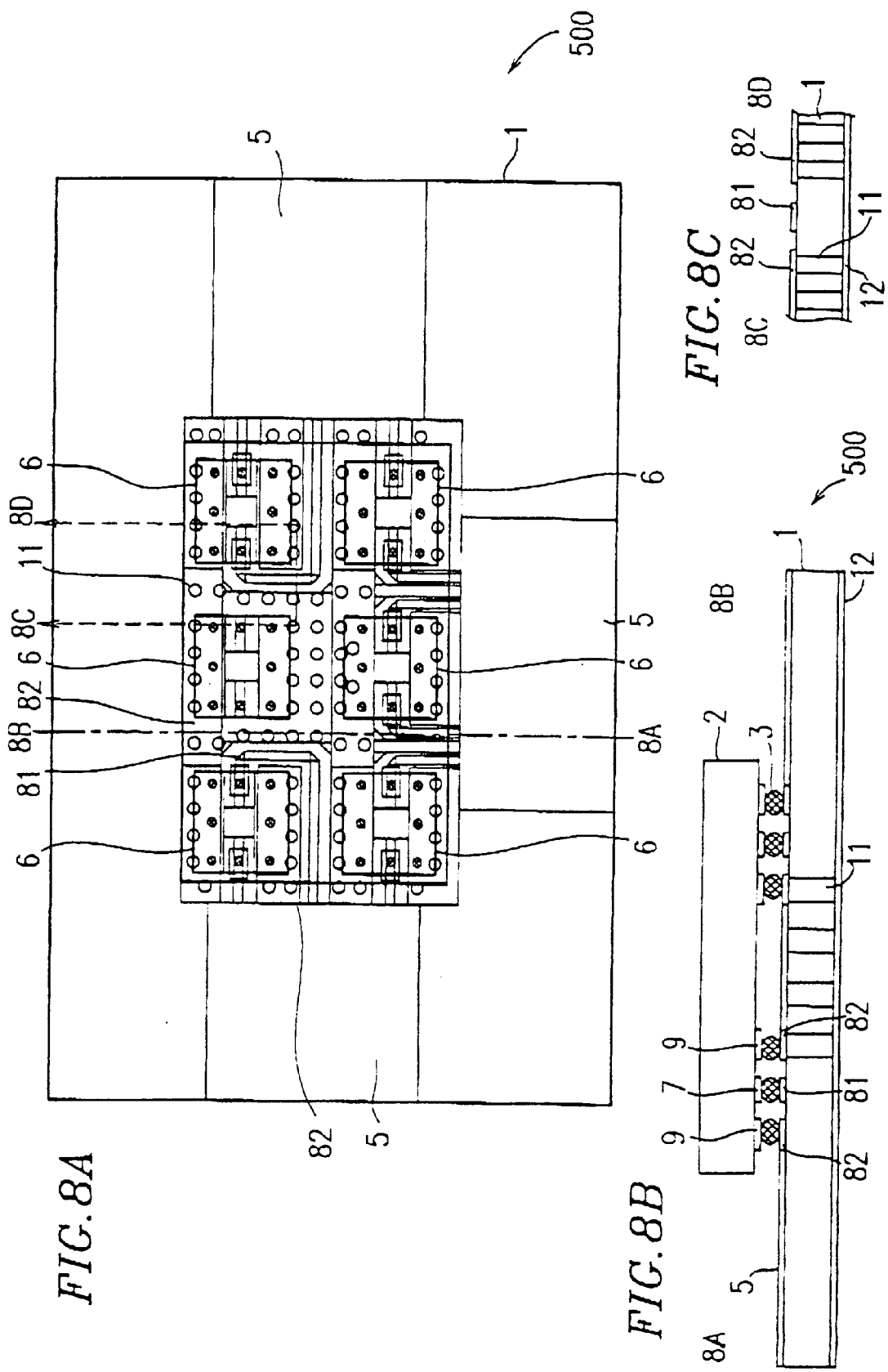

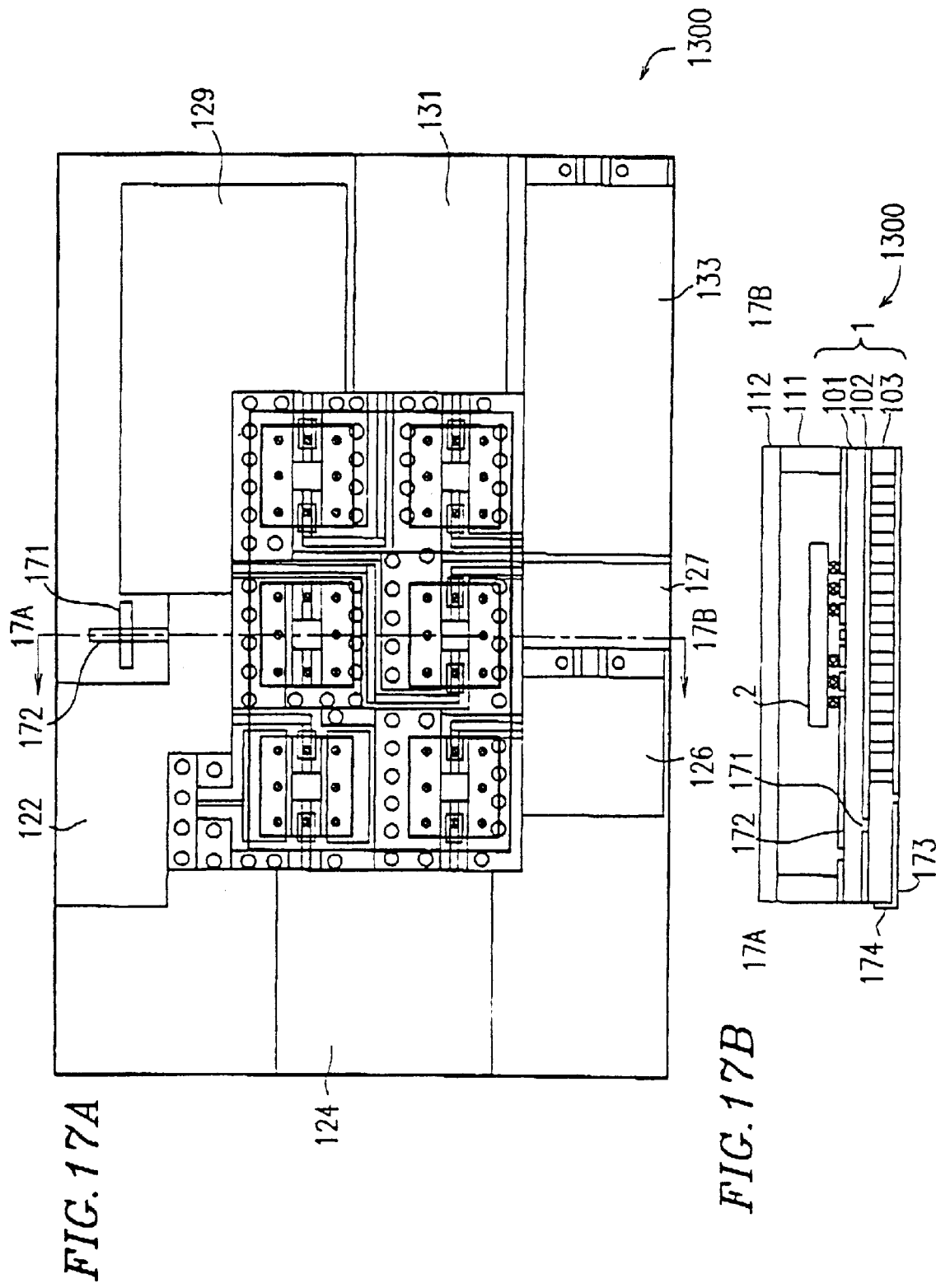

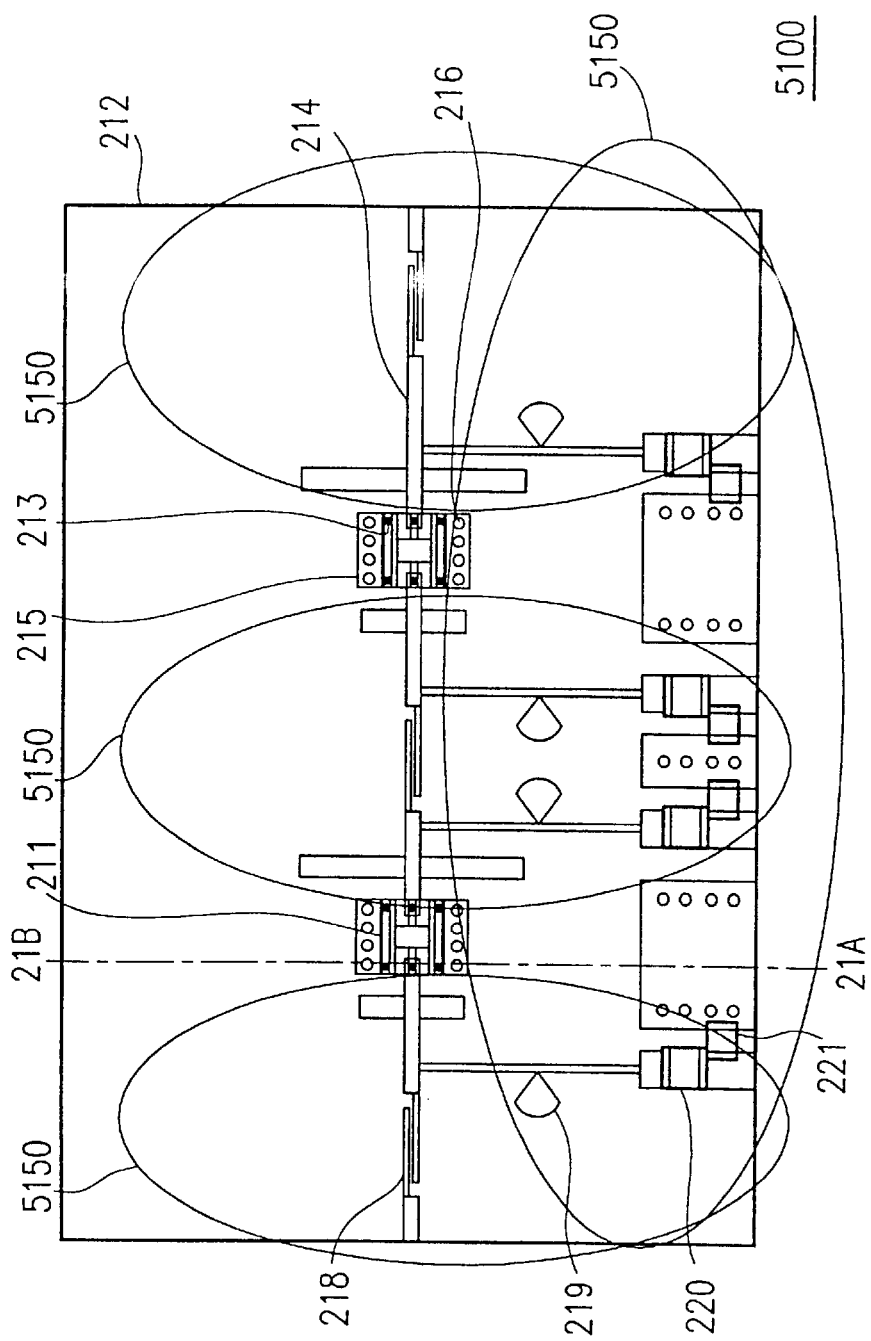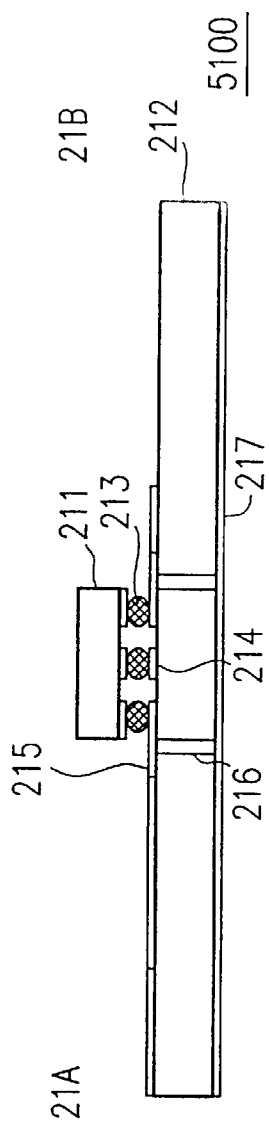
FIG.21A PRIOR ART
FIG.21B PRIOR ART

MICROWAVE AND MILLIMETER WAVE DEVICE MOUNTED ON A SEMICONDUCTIVE SUBSTRATE AND COMPRISED OF DIFFERENT KINDS OF FUNCTIONAL BLOCKS

BACKGROUND OF THE INVENTION

1. Field of the Invention

The present invention relates to a small, light-weight microwave and millimeter wave device which is suitable for mass production and has good high frequency characteristics.

2. Description of the Related Art

In recent years, as the processing speed of a data processing device and the resolution of an image processing device have increased, a high-speed, large-capacity personal communication apparatus using a high frequency wave such as a microwave or a millimeter wave has attracted public attention. As a microwave and millimeter wave device in such a communication apparatus, a module has been actively developed in which a high frequency semiconductor chip is mounted directly on a dielectric substrate having transmission lines thereon. As higher frequencies have been used, a flip-chip mounting method has attracted particular public attention, by which the semiconductor chip is connected onto the dielectric substrate via metal bumps.

FIG. 21 is a schematic diagram illustrating an HMIC 5100 Hybrid Microwave Integrated Circuit) as an exemplary microwave and millimeter wave device. FIG. 21B is a cross-sectional view of the HMIC 5100 taken along line 21A–21B in FIG. 21A.

The HMIC 5100 includes a single transistor chip 211, a dielectric substrate 212 on which passive circuits 5150 in FIG. 21A have been formed by transmission lines, and metal bumps 213 in FIG. 21B. The single transistor chip 211 and the dielectric substrate 212 are attached together, with the respective surface sides facing each other, so that electrodes on the single transistor chip 211 are physically and electrically connected to signal lines 214 and grounding conductor portions 215 on the dielectric substrate 212 via the metal bumps 213. The grounding conductor portions 215 on the surface side of the dielectric substrate 212 are connected to a rounding conductor surface 217 in FIG. B on the reeves side of the dielectric substrate 212 via through holes 216. A DC out capacitor 218, a radial stub 219, a chip resistor 220, a chip capacitor 221, and the like, are formed on the surface side of the dielectric substrate 212 as the passive circuits 5150.

An example of such an HMIC technique is described in 1997 IEEE MTT-S digest, pp. 447–450.

Another such technique is a flip-chip mounting technique of an MMIC (Monolithic Microwave Integrated Circuit) onto the dielectric substrate 212. The MMIC includes an active element such as a transistor and passive elements such as a transmission line, a spiral inductor and a thin film capacitor provided on the same semiconductor chip, thereby implementing functional blocks, such as an amplifier, a mixer and an oscillator, on the semiconductor chip. FIG. 22A illustrates an exemplary MMIC 222 being flip-chip mounted on the dielectric substrate 212, and FIG. 22B is a cross-sectional view taken along line 22A–22B in FIG. 22A.

The illustrated flip-chip structure includes the MMIC 222, the dielectric substrate 212 including transmission lines provided thereon, and the meal bumps 213. The dielectric substrate 212 including transmission lines provided thereon, and the metal bumps 213. The dielectric substrate 212 and the MMIC 222 are attached together, with the respective surface sides acing each other, so that electrodes provided along the periphery of the MMIC 222 are physically and electrically connected to signal lines 224 and the grounding conductor portions 215 on the dielectric substrate 212 via the metal bumps 213. The grounding conductor portions 215 on the surface side of the dielectric substrate 212 are connected to the grounding conductor surface 217 in FIGS. 21B on the reverse side of the dielectric substrate 212 via the through holes 216.

An exemplary MMIC flip=chip technique is described in 1994 IEEE MTT-S digest, pp. 1707–1710.

However, the conventional techniques have the following problems.

For HMIC, the first problem is that the semiconductor chips as the single active elements have to be mounted one by one, thus resulting in a high production cost. The second problem is that the semiconductor chip as the single active element is very small in size, and thus is difficult to handle. As a result, variation in the high frequency characteristics is likely to occur due to misalignment between the individual active elements and the substrate. The third problem is that the number of metal bumps which can be mounted on one semiconductor chip is limited, thereby resulting in an insufficient mounting strength and poor heat radiation characteristics. The fourth problem is that relatively large spacing has to be provided between the individual semiconductor chips for the mounting process, whereby the dielectric substrate requires a large area. Moreover, since such large spacing is provided between the semiconductor chips, the inductance between grounding terminals of each active element increases, whereby the operation of the element becomes unstable.

For MMIC, the first problem is that since the active element and the passive elements are designed and produced on the same semiconductor chip, any design change requires reproduction of the whole device, thereby requiring a long time for the device development. The second problem is that the specific resistance of the semiconductor substrate is smaller than that of the dielectric substrate, and a high Q value cannot be obtained, whereby it is difficult to produce a high-performance passive element. In particular, since the semiconductor substrate has a smaller resistance than that of the dielectric substrate, a passive circuit produced on the semiconductor substrate may suffer from characteristic deterioration due to factors such as leakage of a signal to the substrate. The third problem is that the passive elements occupy a major area of the semiconductor chip, thereby increasing the material cost The fourth problem is that the active element and the passive elements are integrated on the same semiconductor chip with a high density, thereby resulting in a poor electrical isolation characteristic between the respective elements.

Thus, while the HMIC technique and the MMIC technique have some advantages, they also have shortcomings to be overcome.

SUMMARY OF THE INVENTION

A microwave and millimeter wave device of the present invention includes: a dielectric substrate including at least one signal line, a passive circuit and a first grounding conductor portion which are formed on a surface side of the dielectric substrate; and a semiconductor substrate including a plurality of active elements. The signal line is physically and electrically connected to an input/output terminal of the active element via a metal bump; and the first grounding conductor portion is physically and electrically connected to a grounding terminal of the active element via another metal bump.

In one embodiment, the microwave and millimeter wave device further includes a second grounding portion on a surface side of the semiconductor substrate, wherein the second grounding portion is formed by connecting respective grounding terminals of the plurality of active elements to one another via a first conductor.

In one embodiment, a second conductor is provided on a reverse side of the semiconductor substrate; and the grounding conductor portion on the surface side of the semiconductor substrate is connected to the second conductor via a through hole.

In one embodiment, a grounding conductor surface is provided on a reverse side of the dielectric substrate; and the grounding conductor surface is connected to the grounding conductor portion on the surface side of the dielectric substrate via a through hole.

In one embodiment, the dielectric substrate includes a first dielectric layer, an intermediate conductor layer and a second dielectric layer; a grounding conductor surface is provided on a reverse side of the second dielectric layer; a ground conductor portion is provided on the surface side of the dielectric substrate; and through holes are provided to connect between the grounding conductor portion and the intermediate conductor layer and between the intermediate layer and the grounding conductor surface, respectively.

In one embodiment, the intermediate conductor layer includes a slot coupling hole; a second signal line is provided on a reverse side of the second dielectric layer; a first signal line is provided on a surface side of the first dielectric layer; and the second signal line is electromagnetically coupled, for a desired frequency, to the first signal line via the slot coupling hole.

In one embodiment, at least a mixer input matching circuit and a filtering circuit are provided as the passive circuits; and the microwave and millimeter wave device further comprises a frequency conversion device.

In one embodiment, a frame body is provided along a periphery of the dielectric substrate; a lid is provided on the frame body so as to cover the semiconductor substrate; and the frame body and the lid are respectively grounded.

In one embodiment, a first signal line is provided on the surface side of the dielectric substrate; an external connection terminal and a second signal line are provided on a reverse side of the dielectric substrate; the external connection terminal is connected to the second signal line; the second signal line is connected to the first signal line via a through hole or a slit coupling hole; and the first signal line is connected to the passive circuit.

In one embodiment, an input terminal is provided on the surface side of the dielectric substrate; a planar antenna is provided on a reverse side of the dielectric substrate; the planar antenna includes a power supply portion for connection to the surface side of the dielectric substrate; the power supply portion is connected to the input terminal via through hole or a slot coupling hole; and an input is provided from the input terminal to the passive circuit.

The dielectric substrate may be made of silicon having an insulation film on the surface side of the dielectric substrate; and the passive circuit is formed by a semiconductor process for the silicon.

According to another aspect of the present invention, a microwave and millimeter wave device includes: a dielectric substrate including at least one signal line, a passive circuit and a grounding conductor portion which are formed o a surface of the dielectric substrate; and a semiconductor substrate including a plurality of transistors, a diode, and function block constituted by a predetermined circuit element, wherein the dielectric substrate and the semiconductor substrate are physically and electrically connected to each other via a metal bump.

The metal bump may allow connection between terminals provided on the dielectric substrate and the semiconductor substrate.

The dielectric substrate may be a multilayered thin film substrate provided over the semiconductor substrate.

The function block may include a pair of transistors and a pair of diodes.

The function block may include a transistor and a bias circuit for the transistor.

The function block may include a transistor and a feedback circuit for the transistor.

Grounding terminals for the function block and the respective transistors may be provided on the dielectric substrate at such positions as to surround the function block and the transistors.

Alternatively, grounding terminals for the function block and the respective transistors may be provided on the semiconductor substrate at such positions as to surround the function block and the transistors.

Furthermore, grounding terminals for the function block and the respective transistors may be provided on at least one of the dielectric substrate and the semiconductor substrate at such positions as to surround the function block and the transistors.

In one embodiment, the plurality of transistors are arranged to form first and second rows, wherein input and output terminals for the first row are provided on the semiconductor substrate along a first direction while input and output terminals for the second row are provided on the semiconductor substrate along a second direction which is substantially opposite to the first direction.

Thus, the invention described herein makes possible the advantage of providing a small, low-cost microwave and millimeter wave device which allows the development time to be shortened, improves the mounting strength of a semiconductor chip and has good passive element characteristics.

This and other advantages of the present invention will become apparent to those skilled in the art upon reading and understanding the following detailed description with reference to the accompanying figures.

BRIEF DESCRIPTION OF THE DRAWINGS

FIGS. 1A, 1B and 1C illustrate a structure of a microwave and millimeter wave device according to Example 1 of the present invention;

FIGS. 4A and 4B illustrate a structure of a microwave and millimeter wave device according to Example 2 of the present invention;

FIGS. 8A, 8B and 8C illustrate a structure of a microwave and millimeter wave device according to Example 5 of the present invention;

FIGS. 17A and 17B illustrate a structure of a microwave and millimeter wave device according to Example 13 of the present invention;

FIGS. 21A and 21B are schematic diagrams illustrating an HMIC as an exemplary conventional microwave and millimeter wave device.

DESCRIPTION OF THE PREFERRED EMBODIMENTS

EXAMPLE 1

Figure 2A:
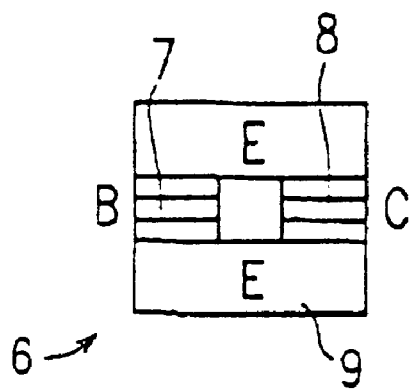
FIGS. 2A and 2B are schematic diagrams for illustrating a hetero-junction bipolar transistor as an exemplary active element.

FIGS. 1A to 1C illustrate a structure of a microwave and millimeter wave device 100 according to Example 1 of the present invention.

FIG. 1A illustrates the microwave and millimeter wave device 100 as viewed from the reverse side of a semiconductor substrate 2, in which the semiconductor substrate 2 has been rendered transparent for detailed illustration of the connections between active elements 6 on the surface side of the semiconductor substrate 2 and a dielectric substrate 1. FIG. 1B is a cross-sectional view taken along line 1A–1B in FIG. 1A. FIG. 1C is a cross-sectional view taken along line 1C–1D in FIG. 1A.

The microwave and millimeter wave device 100 includes: the dielectric substrate 1 having passive circuits 5 formed of microstrip lines; the semiconductor substrate 2 having a group of active elements including a plurality of active elements 6 formed on the surface thereof; and a plurality of metal bumps 3. The passive elements forming the passive circuits 5 on the dielectric substrate 1 are physically and electrically connected to the active elements 6 on the semiconductor substrate 2 via the metal bumps 3.

For the dielectric substrate 1, a ceramic substrate or a resin substrate may be used. On the surface side of the dielectric substrate 1, the passive circuits 5 suitable for the intended purpose are formed beforehand using microstrip lines 4, or the like, by a thick film printing process or by an etching and a plating process. Although the microstrip lines are provided on the dielectric substrate 1 in Example 1, coplanar lines may alternatively be used. The passive circuits 5 may include an impedance-matching circuit, a DC power supply circuit, and the like. In addition to the microstrip lines and the coplanar lines, the passive circuits 5 may also include a chip resistor, a chip capacitor, a chip inductor, and the like.

The semiconductor substrate 2 may be a GaAs substrate or an InP substrate which has a good high frequency characteristic. Then, several single active elements 6, such as a field effect transistor or a hetero-junction bipolar transistor, are provided in a certain layout on the surface of the semiconductor substrate 2 by using a conventional semiconductor process. In view of the typical circuit scale of the microwave and millimeter wave device and the size of the semiconductor substrate, the number of single active elements 6 to be provided is suitably 4 to 6, though the present invention is not limited thereto.

Figure 2B:
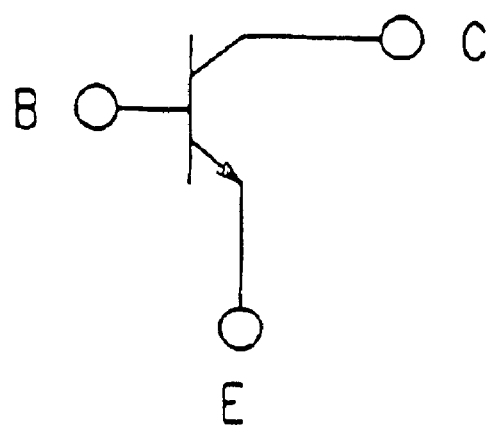

Referring to FIGS. 2A and 2B, a case where a hetero-junction bipolar transistor is used for each of the active elements 6 will be described.

FIG. 2A is a schematic diagram illustrating a hetero-junction bipolar transistor, and FIG. 2B is a circuit diagram of such a hetero-junction bipolar transistor.

A signal is input through an input terminal 7 as a base of the hetero-junction bipolar transistor, and is amplified and output through an output terminal 8 as a collector. The grounding terminal 9 as an emitter is connected to a grounding conductor portion 10 on the dielectric substrate 1 via the metal bumps 3, and is grounded via the grounding conductor portion 10, a through hole 11 and a grounding conductor surface 12.

Similarly, referring to FIGS. 3A and 3B, a case where a field effect transistor is used for each of the active elements 6 will be described.

Figure 3A:
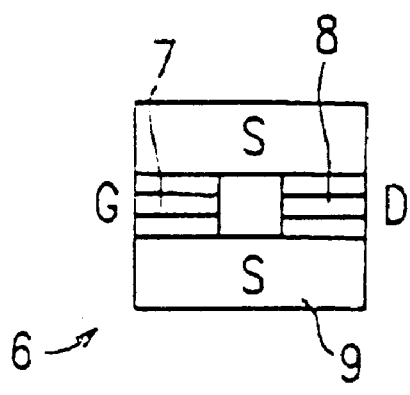
FIGS. 3A and 3B are schematic diagrams for illustrating a field effect transistor as an exemplary active element.
Figure 3B:
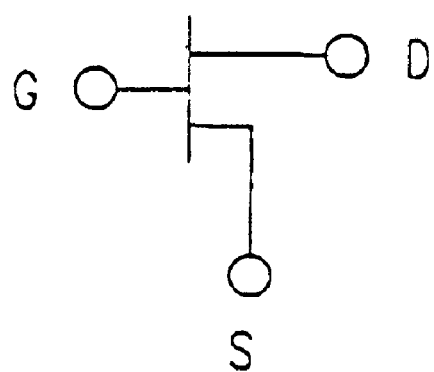

FIG. 3A is a schematic diagram illustrating a field effect transistor, and FIG. 3B is a circuit diagram of such a field effect transistor.

A signal is input through an input terminal 7 as a gate of the field effect transistor, and is amplified and output through an output terminal 8 as a drain. The grounding terminal 9 as a source is connected to a grounding conductor portion 10 on the dielectric substrate 1 via the metal bumps 3, and is grounded via the grounding conductor portion 10, a through hole 11 and a grounding conductor surface 12.

The input terminal 7 of such an active element 6 is connected to the microstrip lines 4 on the dielectric substrate 1, and the output terminal 8 of the active element 6 is connected to the microstrip lines 4 on the dielectric substrate 1 via the metal bumps 3. Metal bumps are provided on selected terminals of the active elements 6 on the semiconductor substrate 2. The semiconductor substrate 2 is mounted onto the dielectric substrate 1 with the surface side of the semiconductor substrate 2 facing the dielectric substrate 1. The mounting process is performed so that each of the metal bumps 3 on the semiconductor substrate 1 are aligned with the corresponding terminals of the passive circuit 5 on the dielectric substrate 1.

The connection between the semiconductor substrate 2 and the dielectric substrate 1 via the metal bumps 3 may be provided by, for example, heating the semiconductor substrate 2 while pressing the substrate 2 against the dielectric substrate 1. For example, Au bumps may be used for the metal bumps 3. Thus, the boundary surface of the metal bumps 3 with the grounding conductor portion 10 and the microstrip lines 4 on the dielectric substrate 1 is alloyed, thereby electrically and physically connecting the substrates together.

Typically, the microwave and millimeter wave device includes: an active element for amplifying or modulating a signal; and a passive element such as an impedance-matching circuit, a DC power supply circuit, and the like. In the present invention, only the active element 6 is implemented on the semiconductor substrate 2, while only the passive element 5 is implemented on the dielectric substrate 1. In such a structure, a plurality of active elements 6 are arranged on one semiconductor substrate 2, whereby the semiconductor substrate 2 can be mounted on the dielectric substrate 1 through a single flip-chip mounting process. Since the semiconductor substrate 2 has a sufficient area, it is easy to handle, and misalignment with respect to the dielectric substrate 1 is less likely to occur. Furthermore, as compared to HMIC, there are more metal bumps 3 employed for connecting the semiconductor substrate 2 with the dielectric substrate 1, thereby obtaining a sufficient mounting strength. Since only the active elements 6 are provided on the semiconductor substrate 2, it is possible to reduce the material cost. Moreover, in the present invention, the passive circuit 5 is provided on the dielectric substrate 1, thereby obtaining the passive circuit 5 having a high Q value.

More importantly, it is possible to produce the general-purpose semiconductor substrate 2 which can be used for any circuit system, whereby the circuit design can be determined only by the dielectric substrate 1. Moreover, not all of the active elements 6 and the terminals on the semiconductor substrate 2 are necessarily used, but the passive circuit 5 can be designed so that only some of the active elements 6 and the terminals are used. Furthermore, a design change can be made simply by changing the passive circuits 5 on the dielectric substrate 1, thereby shortening the development time.

EXAMPLE 2

FIGS. 4A and 4B illustrate a structure of a microwave and millimeter wave device 200 according to Example 2 of the present invention.

FIG. 4A illustrates the microwave and millimeter wave device 200 as viewed from the reverse side of the semiconductor substrate 2, in which the semiconductor substrate 2 has been rendered transparent for detailed illustration of the connections between the active elements 41, 42, 43, 44, and 45 on the surface side of the semiconductor substrate 2 and the dielectric substrate 1. FIG. 4B is a cross-sectional view taken along line 4A–4B in FIG. 4A. In FIGS. 4A and 4B, the components also shown in FIGS. 1A, 1B and 1C are denoted by the same reference numerals and will not further be described below as they function in substantially the same way as described in Example 1 above.

The device 200 of Example 2 can be characterized by the arrangement of the active elements 41 to 45 on the semiconductor substrate 2. In particular, as compared to Example 1 illustrated in FIGS. 1A to 1C, the active elements 41 to 45 are arranged on the semiconductor substrate 2 into an array such that the respective active elements 41 to 45 have alternating input/output directions. As illustrated in FIG. 4A, the active elements 41 to 45 are arranged to have alternating input directions, i.e., the active elements 41, 43 and 45 have one input direction, while the other active elements 42 and 44 have the opposite input direction. Therefore, the input terminal 7 of one active element and the output terminal 8 of an adjacent active element are located on the same side, thereby facilitating the arrangement of the passive elements 5 for connecting two adjacent active elements together.

EXAMPLE 3

FIGS. 5A, 5B, 6A and 6B illustrate a structure of a microwave and millimeter wave device 300 according to Example 3 of the present invention.

Figure 5A:
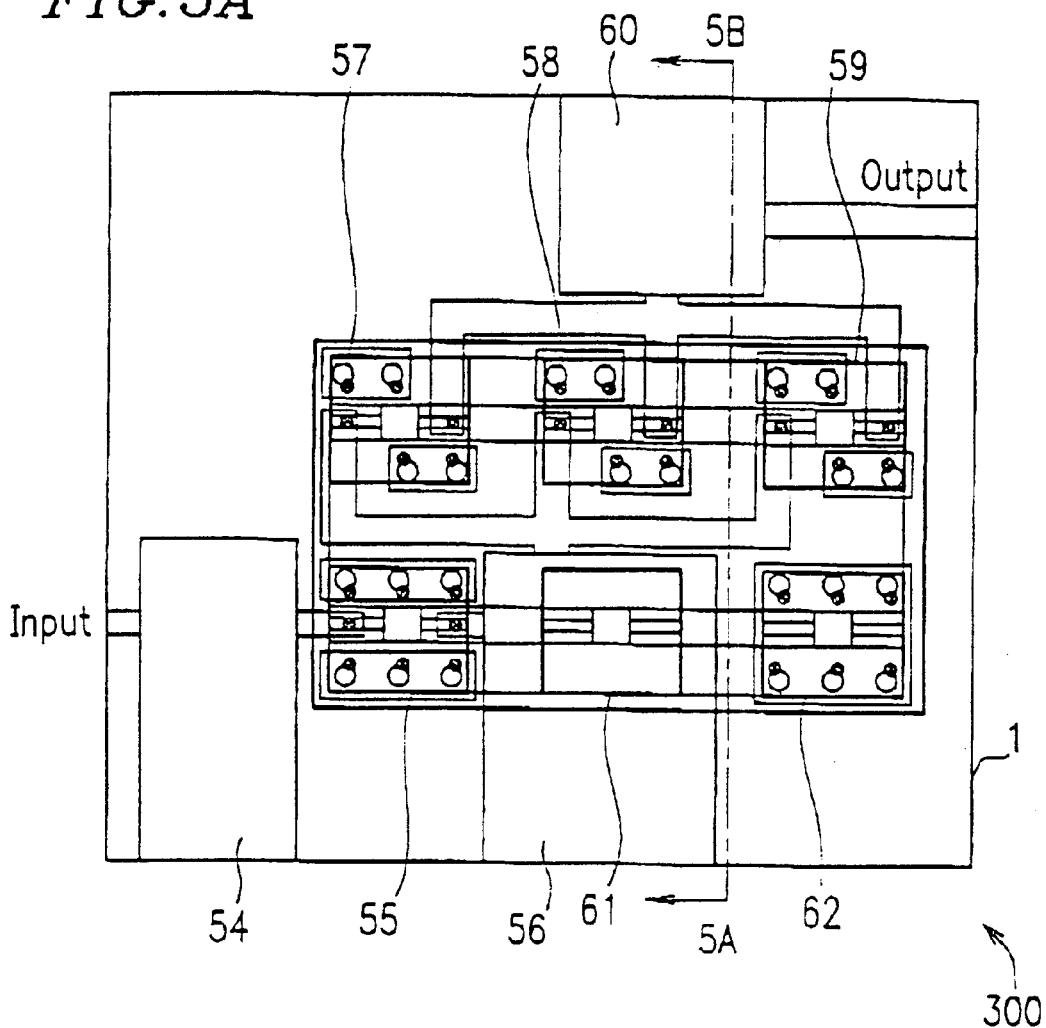
FIGS. 5A and 5B illustrate a structure of a microwave and millimeter wave device according to Example 3 of the present invention.
Figure 5B:
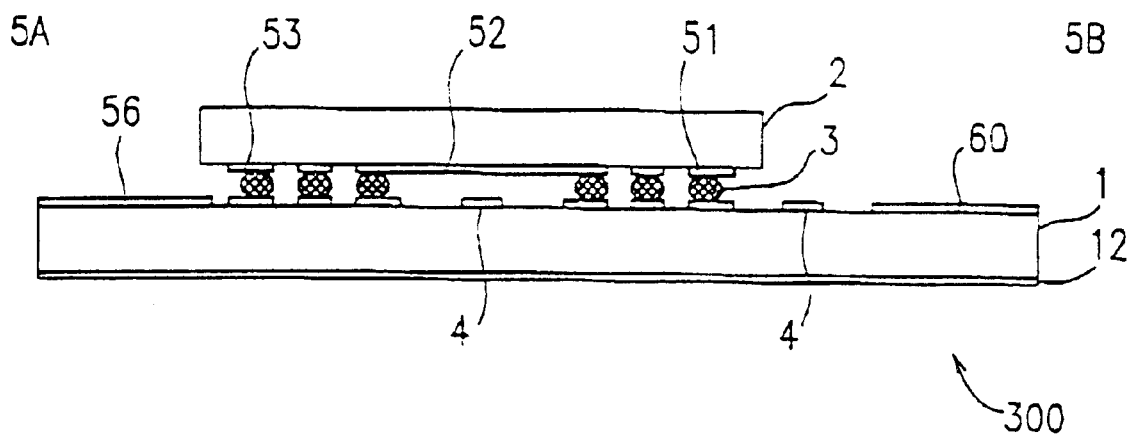
Figure 6A:
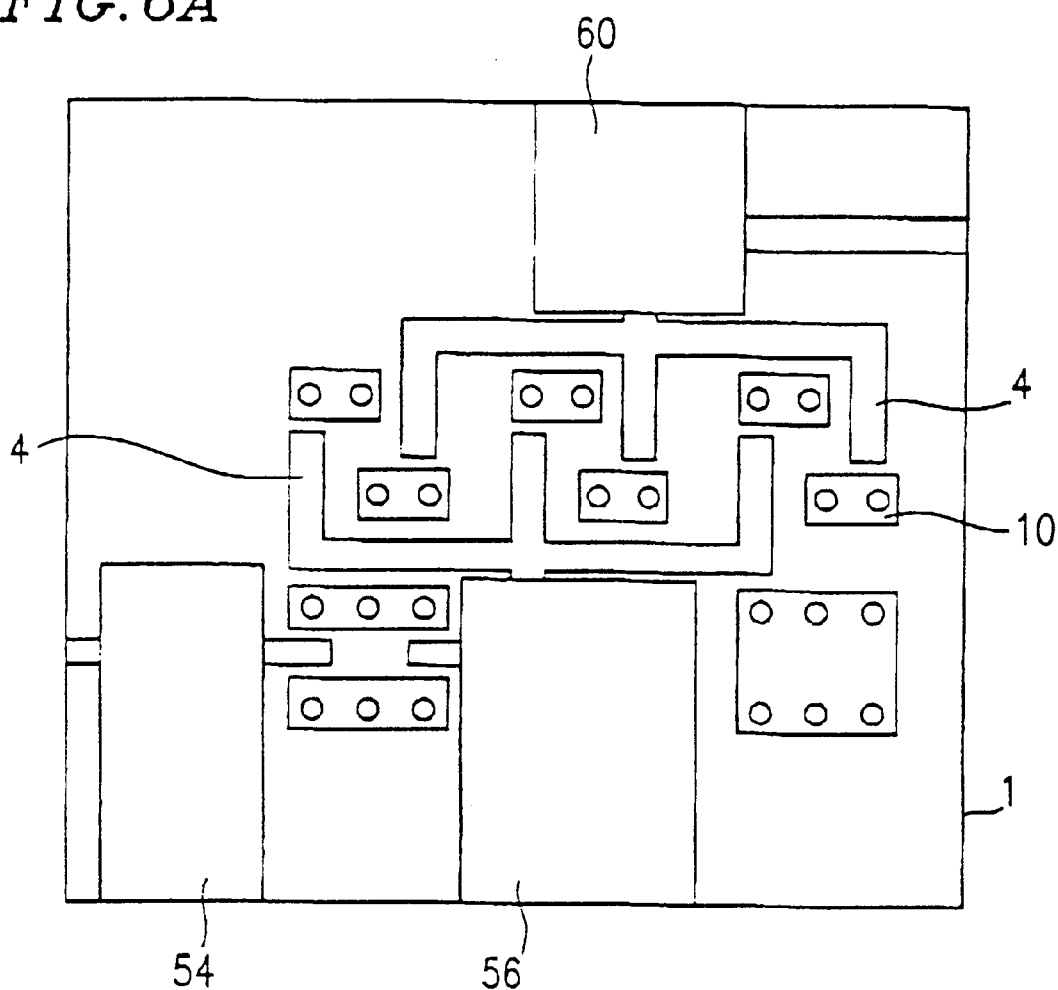
FIGS. 6A and 6B illustrate a structure of a microwave and millimeter wave device according to Example 3 of the present invention.
Figure 6B:
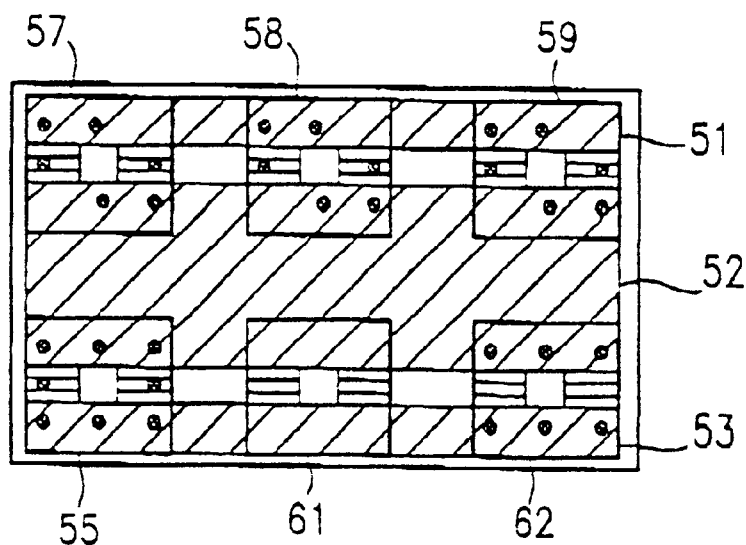

FIG. 5A illustrates the microwave and millimeter wave device 300 as viewed from the reverse side of the semiconductor substrate 2, in which the semiconductor substrate 2 has been rendered transparent for detailed illustration of the connections between the active elements 55, 57, 58, 59, 61 and 62 on the surface side of the semiconductor substrate 2 and the dielectric substrate 1. FIG. 5B is a cross-sectional view taken along line 5A–5B in FIG. 5A, as viewed from the direction indicated by the arrows. FIG. 6A illustrates passive elements 54, 56 and 60, the microstrip lines 4 and the grounding terminals 10 provided on the dielectric substrate 1. FIG. 6B illustrates the above-mentioned active elements provided on the semiconductor substrate 2. In FIGS. 5A, 5B, 6A and 6B the components also shown in FIGS. 1A, 1B and 1C are denoted by the same reference numerals and will not further be described below as they function in substantially the same way as described in Example 1 below.

The device 300 of Example 3 can be characterized in that the grounding terminals 10 in FIG. 6A of the active elements on the semiconductor substrate 2 are connected with one another via a conductor, and that a power amplifier is implemented as an exemplary circuit form. The grounding terminals 10 of the active elements on the semiconductor substrate 2 are connected with one another via grounding conductors 51, 52 and 53, respectively. Since the grounding terminals 10 of all the active elements are connected with one another on the semiconductor substrate 2 via grounding conductors 51, 52 and 53, the grounding inductance between the active elements is reduced, and the signal isolation between the active elements is increased.

Referring to FIGS. 5A, 5B, 6A and 6B, an operation of the power amplifier of the present example will be described.

An input signal passes through the passive element 54 on the dielectric substrate 1, and is input to the active element 55 on the semiconductor substrate 2. The signal is amplified by the active element 55, and passes through the passive circuit 56. Then, the signal is divided into three signals by the microstrip line 4, in FIGS. 5B, 6A and are input to the active elements 57, 58 and 59 on the semiconductor substrate 2, respectively. The signals are amplified by the active elements 57, 58 and 59, respectively, and synthesized back into one signal by the microstrip line 4 on the dielectric substrate 1. Then, the signal is output through the passive element 60. In the present example, the active element 61 is not used, and only the grounding terminal of the active element 62 is used.

EXAMPLE 4

Figure 7A:
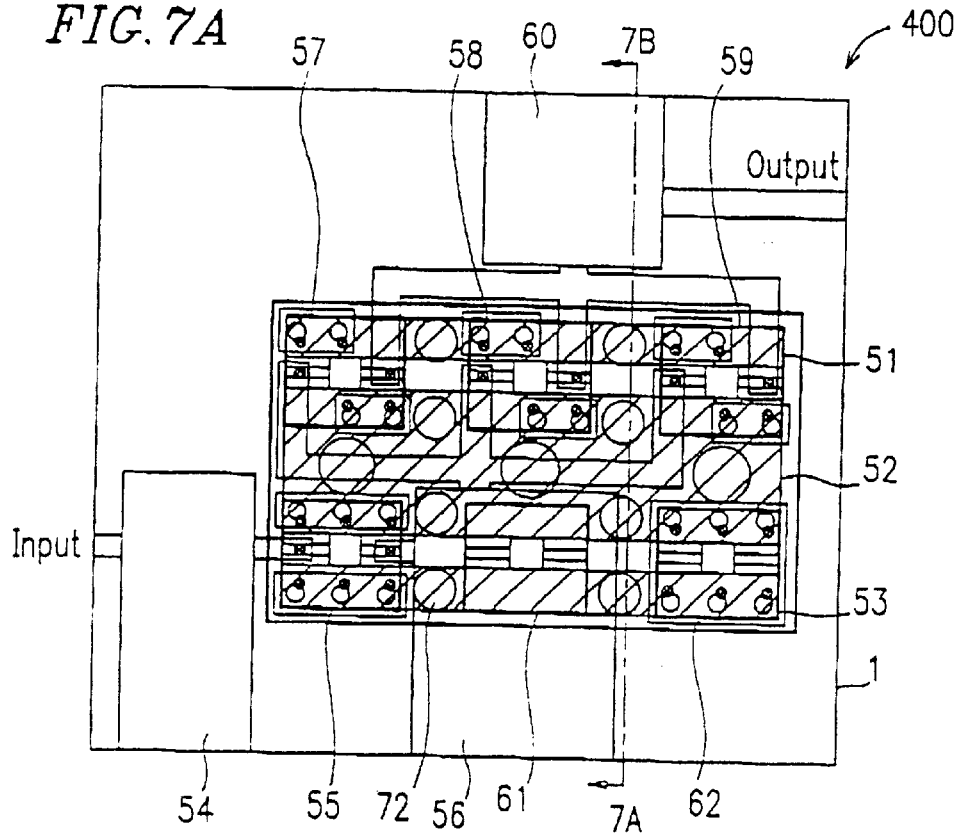
FIGS. 7A, 7B and 7C illustrate a structure of a microwave and millimeter wave device according to Example 4 of the present invention.
Figure 7B:
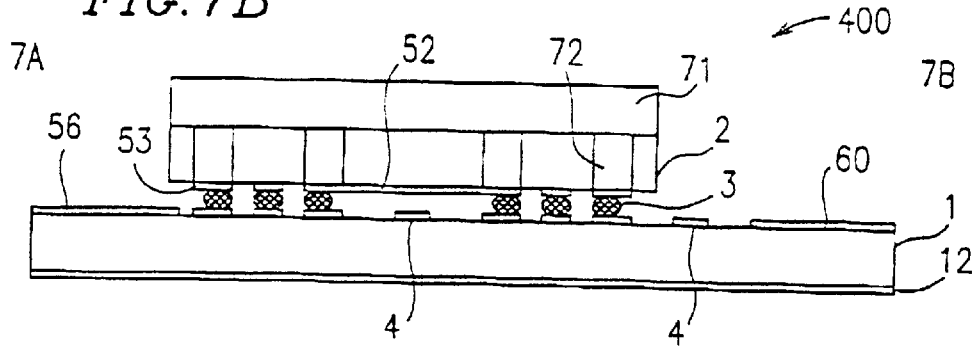
Figure 7C:
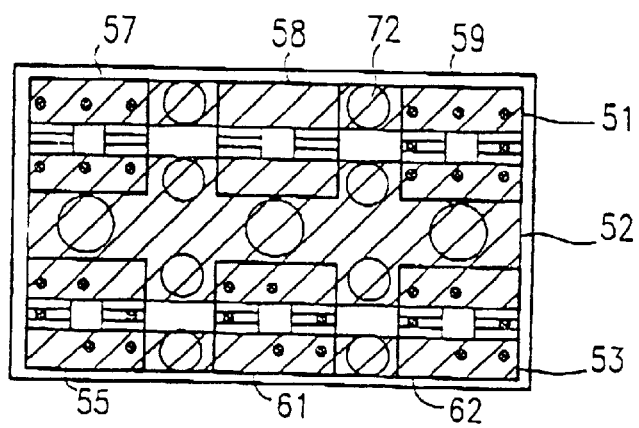

FIGS. 7A to 7C illustrate a structure of a microwave and millimeter wave device 400 according to Example 4 of the present invention.

FIG. 7A illustrates the microwave and millimeter wave diode 400 as viewed from the reverse side of the semiconductor substrate 2, in which the semiconductor substrate 2 has been rendered transparent for detailed illustration of the connections between the active elements 55, 57, 58, 59, 61 and 62 on the surface side of the semiconductor substrate 2 and the dielectric substrate 1. FIG. 7B is a cross-sectional view taken along line 7A–7B in FIG. 7A, as viewed from the direction indicated by the arrows. FIG. 7C illustrates the above-mentioned active elements provided on the semiconductor substrate 2. In FIGS. 7A, 7B and 7C, the components also shown in FIGS. 5A and 5B are denoted by the same reference numerals and will not further be described below as they function in substantially the same way as described in Example 3 above.

A difference between Example 4 and Example 3 is that the semiconductor substrate 2 includes a conductor 71 on the reverse side thereof, and the conductors 51, 52 and 53 on the surface side of the semiconductor substrate 2 are connected to the conductor 71 on the reverse side of the semiconductor substrate 2 via a conductive through hole 72. The other components function in substantially the same way as described in the above examples, and thus will not further be described below.

When the above active elements are power amplifiers, the problem associated with heat generation therefrom has to be addressed. In Example 4, the heat generated from the active elements is not only transferred to the dielectric substrate 1, but also is transferred to the conductor 71 on the reverse side of the semiconductor substrate 2 via the through hole 72 and radiated therefrom.

EXAMPLE 5

FIGS. 8A to 8C illustrate a structure of a microwave and millimeter wave device 500 according to Example 5 of the present invention.

FIG. 8A illustrates the microwave and millimeter wave device 500 as viewed from the reverse side of the semiconductor substrate 2, in which the semiconductor substrate 2 has been rendered transparent for detailed illustration of the connections between the active elements 6 on the surface side of the semiconductor substrate 2 and the dielectric substrate 1. FIG. 8B is a cross-sectional view taken along line 8A–8B in FIG. 8A, as viewed from the direction indicated by the arrows. FIG. 8C is a cross-sectional view taken along line 8C–8D in FIG. 8A, as viewed from the direction indicated by the arrows. In FIGS. 8A and 8B, the components also shown in FIGS. 1A to 1C are denoted by the same reference numerals and will not further be described below as they function in substantially the same way as described in Example 1 above.

A different between Example 5 and Example 1 is that the passive circuits 5 are formed on the dielectric substrate 1 using coplanar lines. The coplanar lines include a signal line 81 and grounding conductor portions 82 on the dielectric substrate 1, and the characteristic impedance is determined by the width of the signal line 81 and the distance between the signal line 81 and the grounding conductor portion 82 in FIG. 8C.

In order to obtain a stable transmission characteristic using a coplanar line, it is important to stabilize the potential of the grounding conductor portions 82. Therefore, in the present example, the grounding conductor portions 82 on the surface side of the dielectric substrate 1 are connected to the grounding conductor surface 12 on the reverse side thereof via the through holes 11, thereby securing the grounding of the coplanar lines and thus enabling a stable operation of the device.

EXAMPLE 6

Figure 9A:
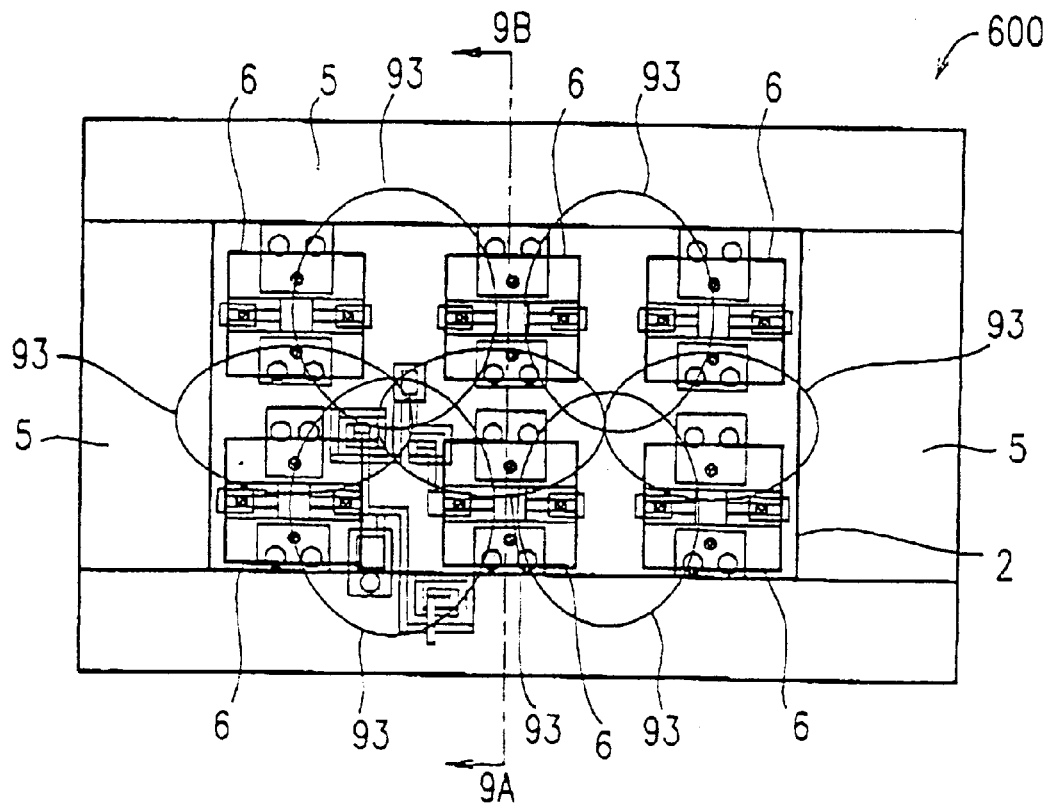
FIGS. 9A and 9B illustrate a structure of a microwave and millimeter wave device according to Example 6 of the present invention.
Figure 9B:
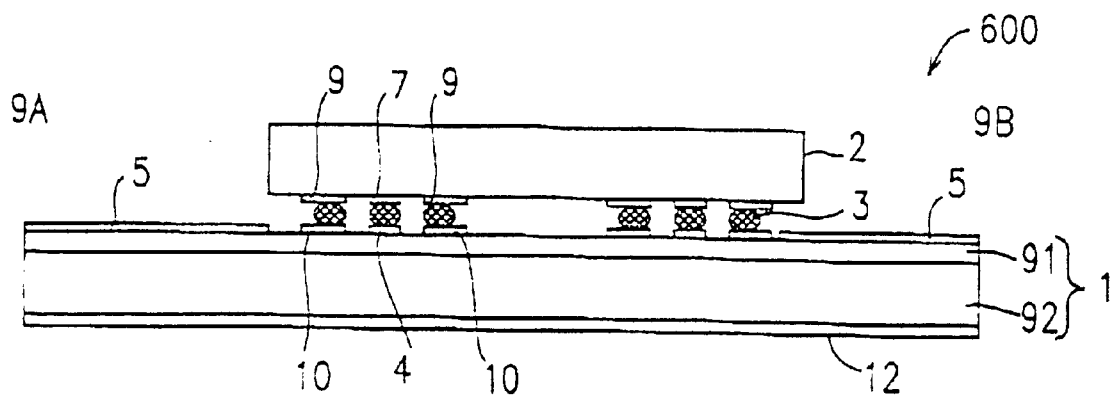

FIGS. 9A and 9B illustrate a structure of a microwave and millimeter wave device 600 according to Example 6 of the present invention.

FIG. 9A illustrates the microwave and millimeter wave device 600 as viewed from the reverse side of the semiconductor substrate 2, in which the semiconductor substrate 2 has been rendered transparent for detailed illustration of the connections between the active elements 6 on the surface side of the semiconductor substrate 2 and the dielectric substrate 1. FIG. 9B is a cross-sectional view taken along line 9A–9B in FIG. 9A, as viewed from the direction indicated by the arrows. In FIGS. 9A and 9B, the components also shown in FIGS. 1A to 1C are denoted by the same reference numerals and will not further be described below as they function in substantially the same way as described in Example 1 above.

The device 600 of the present example is different from the microwave and millimeter wave device 100 of Example 1 described in connection with FIGS. 1A to 1C in that a silicon substrate 92 including an insulation layer 91 deposited thereon is used for the dielectric substrate 1, and that active circuits 93 are provided by a semiconductor process.

The silicon substrate 92 has a specific resistance lower than other dielectric materials, and thus, the silicon substrate does not provide a high Q value in a passive circuit. However, the silicon substrate is inexpensive and allows for the use of a semiconductor process. Therefore, passive elements, such as a thin film capacitor, a spiral inductor or a resistor, can be integrated on the substrate with a high density. When the silicon substrate 92 having the insulation layer 91 is used, the active circuits 93 such as the spiral inductor can be provided on the reverse side of the semiconductor substrate 2, thereby contributing to increasing the density of the passive circuits. Thus, the size of the microwave and millimeter wave device can be greatly reduced. It is particularly suitable for applications with a relatively low frequency which do not require very high performance of the passive elements.

EXAMPLE 7

Figure 10:
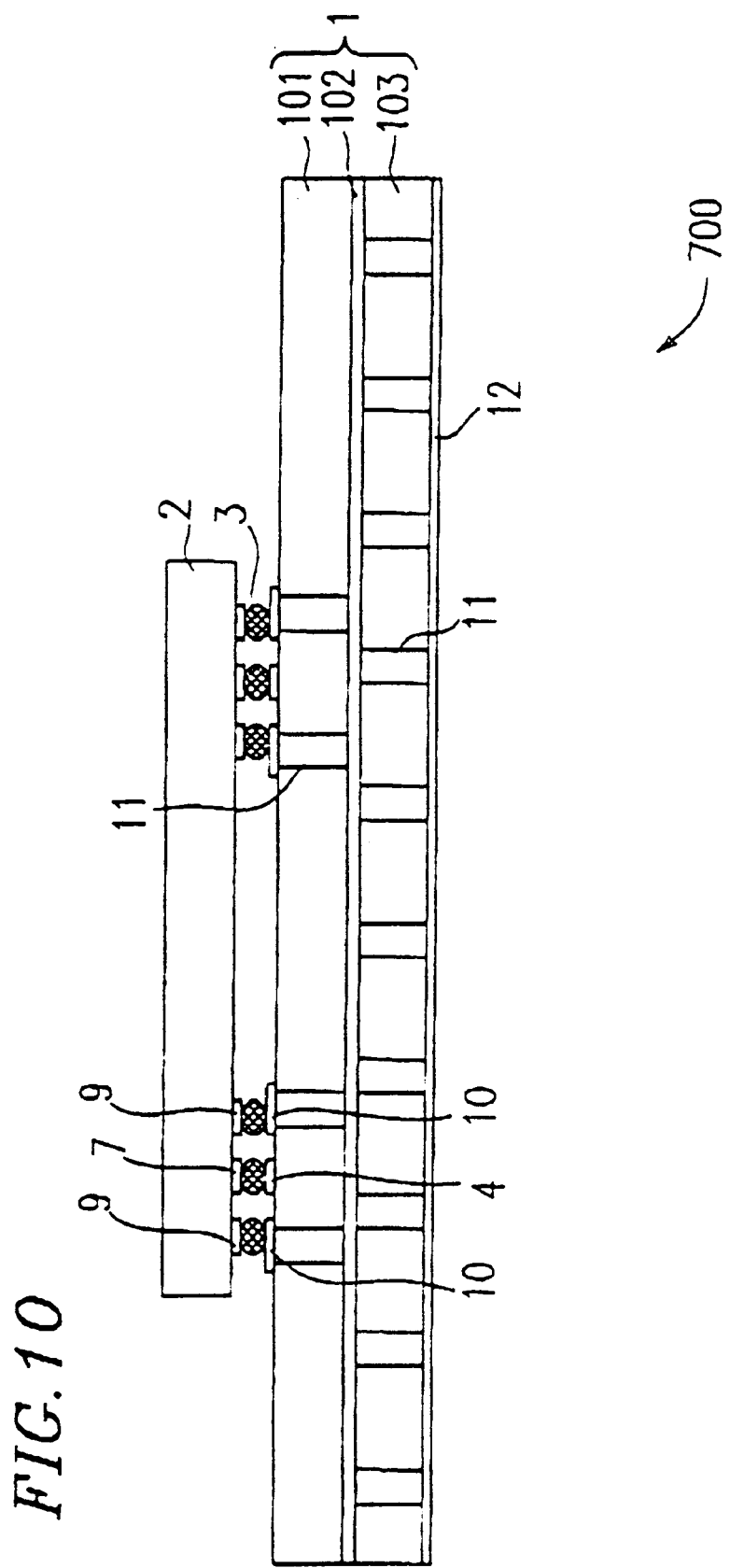
FIG. 10 illustrates a structure of a microwave and millimeter wave device according to Example 7 of the present invention.

FIG. 10 is a cross-sectional view illustrating a microwave and millimeter wave device 700 according to Example 7 of the present invention. In FIG. 10, the components also shown in FIGS. 1A to 1C are denoted by the same reference numerals and will not further be described below as they function in substantially the same way as described in Example 1 above.

Example 7 is different from Example 1 described in connection with FIGS. 1A to 1C in the following points. As the dielectric substrate 1, a first dielectric layer 101, an intermediate conductor layer 102 and a second dielectric layer 103 are deposited. The grounding conductor surface 12 is provided partially or entirely over the reverse side of the second dielectric layer 103. The grounding conductor portions 10 on the surface side of the first dielectric layer 101 are connected to the intermediate conductor layer 102 via the through holes 11, and the intermediate conductor layer 102 is connected to the grounding conductor surface 12 via the through holes 11.

Particularly, when the passive circuits are formed by the microstrip lines as in Example 1, the distance between the microstrip lines and the grounding conductor surface 12 has to be reduced as the frequency increases, thereby reducing the thickness of the dielectric substrate. This may result in decrease in the mechanical strength of the dielectric substrate. However, by depositing as the dielectric substrate 1, the first dielectric layer 101, the intermediate conductor layer 102 and the second dielectric layer 103, as in the present example, it is possible to determine the characteristic impedance of the microstrip lines by the signal lines on the first dielectric layer 101 and the intermediate conductor layer 102, while increasing the mechanical strength of the dielectric substrate by the second dielectric layer 103. Moreover, it may not be necessary to use the same material for the first dielectric layer 101 and the second dielectric layer 103.

EXAMPLE 8

Figures 11A, 11B:
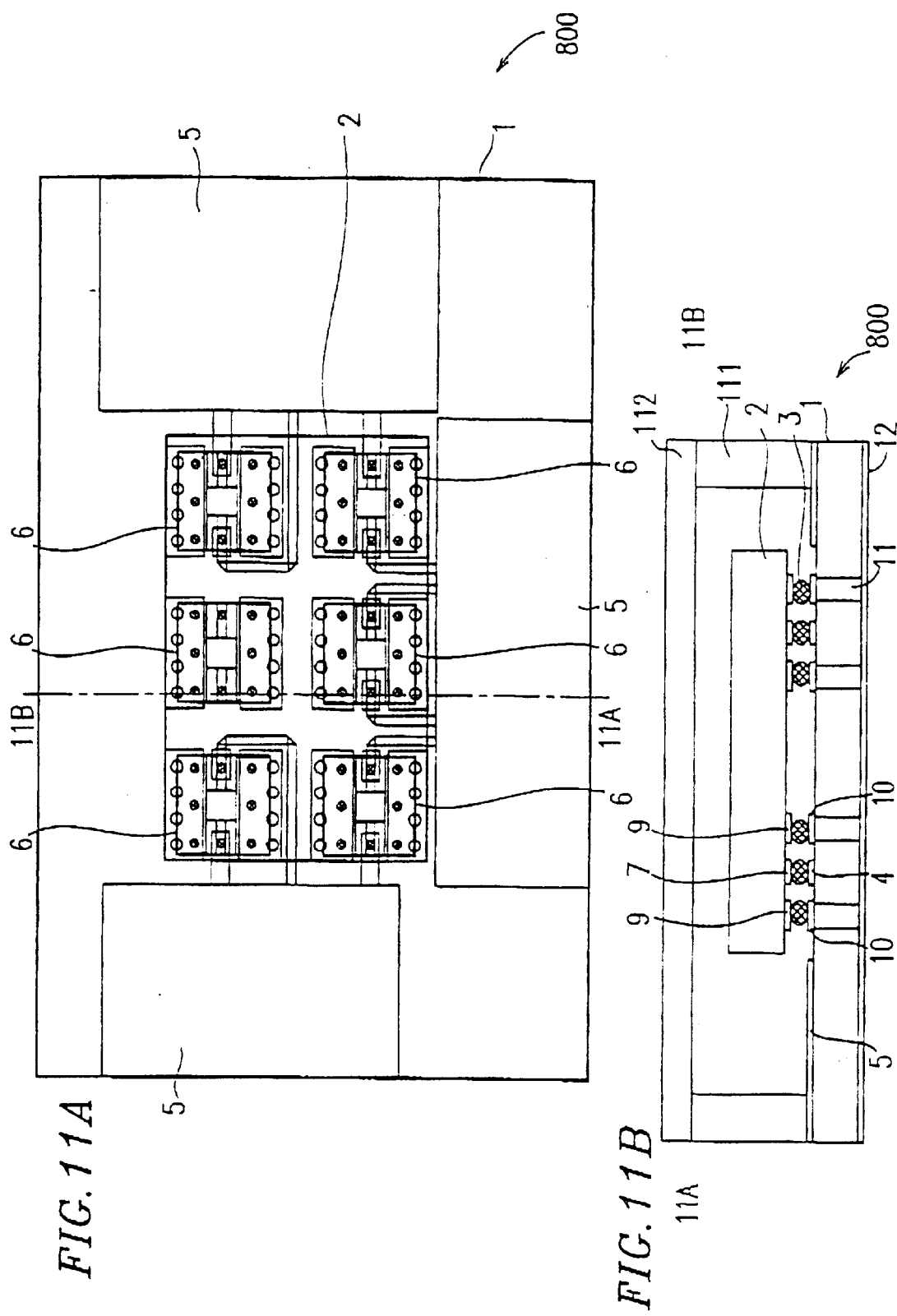
FIGS. 11A and 11B illustrate a structure of a microwave and millimeter wave device according to Example 8 of the present invention.

FIGS. 11A and 11B illustrate a structure of a microwave and millimeter wave device 800 according to Example 8 of the present invention.

FIG. 11A illustrates the microwave and millimeter wave device 800 as viewed from the reverse side of the semiconductor substrate 2, in which the semiconductor substrate 2 has been rendered transparent for detailed illustration of the connections between the active elements 6 on the surface side of the semiconductor substrate 2 and the dielectric substrate 1. FIG. 11B is a cross-sectional view taken along line 11A–11B in FIG. 11A. In FIGS. 11A and 11B, the components also shown in FIGS. 1A to 1C are denoted by the same reference numerals and will not further be described below as they function in substantially the same way as described in Example 1 above.

Example 8 is different from Example 1 described in connection with FIGS. 1A to 1C in the following points. A frame body 111 of metallized side walls is provided along the periphery of the dielectric substrate 1. Moreover, a metallized lid 112 is provided on the frame body 111 so as to cover the semiconductor substrate 2. The grounding conductor portions 10 on the surface side of the dielectric substrate 1 are physically and electrically connected to the frame body 111, which in turn is physically and electrically connected to the lid 112. The frame body 111 and the lid 112 serve to prevent unwanted radiation from or into the active elements 6 on the semiconductor substrate 2 and the passive elements on the dielectric substrate 1.

When the device is used in the millimeter wave band at a frequency of about 30 GHz or greater, an unwanted wave in the waveguide mode inside the frame body 111 can be eliminated since the frame body 111 and the lid 112 are electrically grounded, while the semiconductor substrate 2 and the dielectric substrate 1 are three-dimensionally grounded via the metal bumps 3. This improves the isolation characteristic between the input and the output, and thus realize a good and stable characteristic.

While a metallized material is used for the frame body 111 and the lid 112 in the present example, a metal material may alternatively be used.

EXAMPLE 9

Figure 12:
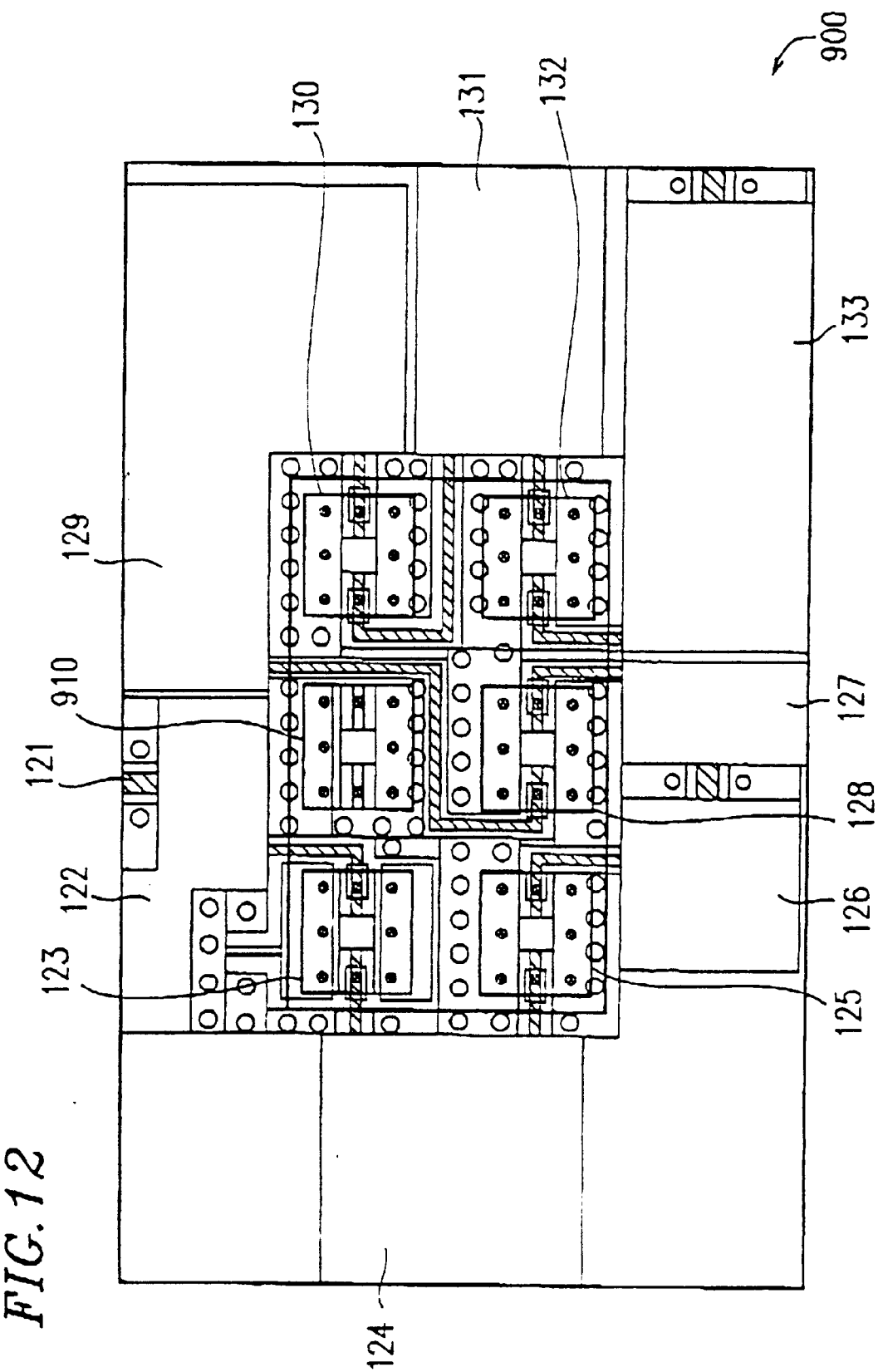
FIG. 12 illustrates a structure of a microwave and millimeter wave device according to Example 9 of the present invention.

FIG. 12 illustrates a microwave and millimeter wave device 900 according to Example 9 of the present invention. FIG. 12 illustrates the microwave and millimeter wave device 900 as viewed from the reverse side of the semiconductor substrate, in which the semiconductor substrate has been rendered transparent for detailed illustration of the connections between the active elements on the surface side of the semiconductor substrate and the dielectric substrate.

The structure of the device 900 in this example is substantially the same as that of Example 5 described in connection with FIG. 8, but the present example illustrates an exemplary structure of a down converter which functions as a high frequency amplifier, a mixer and a intermediate frequency amplifier.

A high frequency signal is input through an input terminal 121 to an input matching circuit/power supply circuit 122, and is amplified by an active element 123. Then, the amplified signal passes through an interstage matching circuit/power supply circuit 124, and is further amplified by an active element 125. The high frequency signal output from the active element 125 is subjected to impedance matching and the unwanted wave thereof is removed by an output matching circuit/power supply circuit/filtering circuit 126, and is then input to a mixer input matching circuit/local supply circuit 127. The high frequency signal is synthesized with a local oscillation signal generated by a local oscillation circuit, and input to an active element 128. Due to the non-linearity of the active element 128, the high frequency signal and the local oscillation signal are mixed together, thereby generating an intermediate frequency signal corresponding to the frequency difference component between the high frequency signal and the local oscillation signal. The intermediate frequency signal passes through an IF input matching circuit/power supply circuit 129, and is amplified by an active element 130. Then, the amplified signal passes through an IF interstage matching circuit/power supply circuit 131, and is further amplified by an active element 132 to be output through an IF output matching circuit/power supply circuit 133. An active element 910 is not used.

While Example 9 illustrates an example where the passive circuits are formed of coplanar lines, they may alternatively be formed of microstrip lines as in Example 1. Moreover, while Example 9 illustrates a down converter for converting a high frequency signal to an intermediate frequency signal, an up converter for converting an intermediate frequency signal to a high frequency signal can be formed in substantially the same manner.

It is possible, as in the present example, for one semiconductor chip to be used to provide frequency conversion devices such as a down converter or an up converter. When the conventional MMIC or HMIC structure is used to provide a frequency conversion device for the millimeter wave band at a frequency of about 30 GHz or greater, the characteristic of some circuits such as a mixer circuit or a filtering circuit included in the resultant frequency conversion device often deteriorates. On the other hand, according to the present example, such deterioration can be prevented.

EXAMPLE 10

Figure 13:
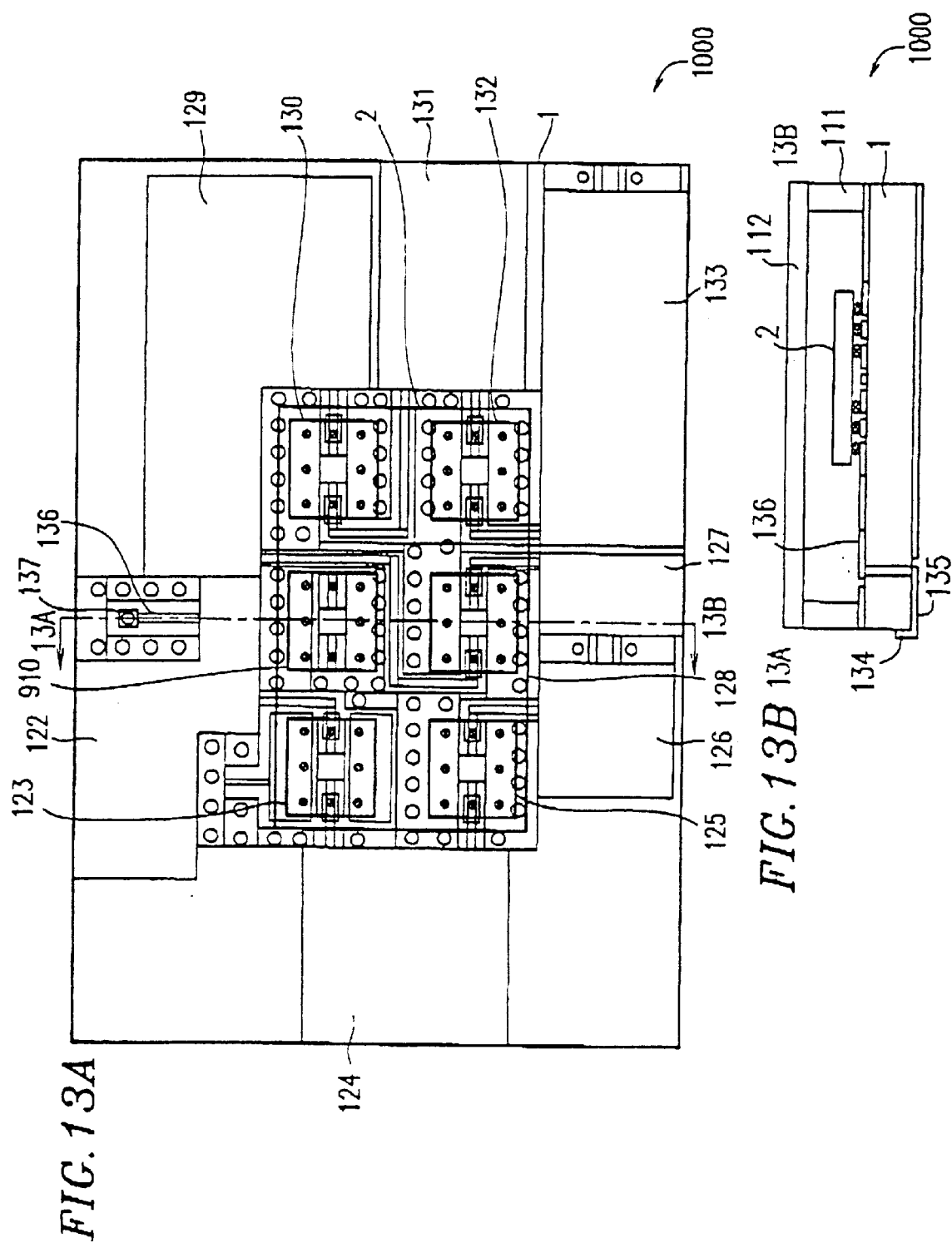
FIGS. 13A and 13B illustrate a structure a structure of a microwave and millimeter wave device according to Example 10 of the present invention.

FIGS. 13A and 13B illustrate a microwave and millimeter wave device 1000 according to Example 10 of the present invention.

FIG. 13A illustrates the microwave and millimeter wave device 1000 as viewed from the reverse side of the semiconductor substrate, in which the semiconductor substrate has been rendered transparent for detailed illustration of the connections between the active elements on the surface side of the semiconductor substrate and the dielectric substrate. FIG. 13B is a cross-sectional view taken along line 13A–13B in FIG. 13A, as viewed from the direction indicated by the arrows.

The microwave and millimeter wave device 1000 of Example 10 has substantially the same structure as that of the microwave and millimeter wave device 900 of Example 9, but is different in that an external connection terminal 134 is provided.

Specifically, in the device 1000, the reverse side of the dielectric substrate 1 includes a signal line 135 as a coplanar line, one end of which serves as the external connection terminal 134. On the surface side of the dielectric substrate 1, the input terminal is extracted by a signal line 136 as a coplanar line, and the signal line 136 is connected to the outer end of the signal line 135 as a coplanar line on the reverse side of the dielectric substrate 1 via a through hole 137. Moreover, the frame body 111 of metallized side walls is provided along the periphery of the dielectric substrate 1, and the metallized lid 112 is provided on the frame body 111 so as to cover the semiconductor substrate 2. The grounding conductor portions on the surface side of the dielectric substrate 1 are physically and electrically connected to the frame body 111, which in turn is physically and electrically connected to the lid 112. The frame body 111 and the lid 112 serve to prevent unwanted radiation from or into the active elements on the semiconductor substrate 2 and the passive elements on the dielectric substrate 1. Moreover, by providing the signal line 136 as a coplanar line on the reverse side of the dielectric substrate 1 from the through hole 137, the frame body 111 and the lid 112, it is possible to output a signal without being affected by an electromagnetic field radiated from the circuits on the surface side of the dielectric substrate 1.

EXAMPLE 11

Figure 14:
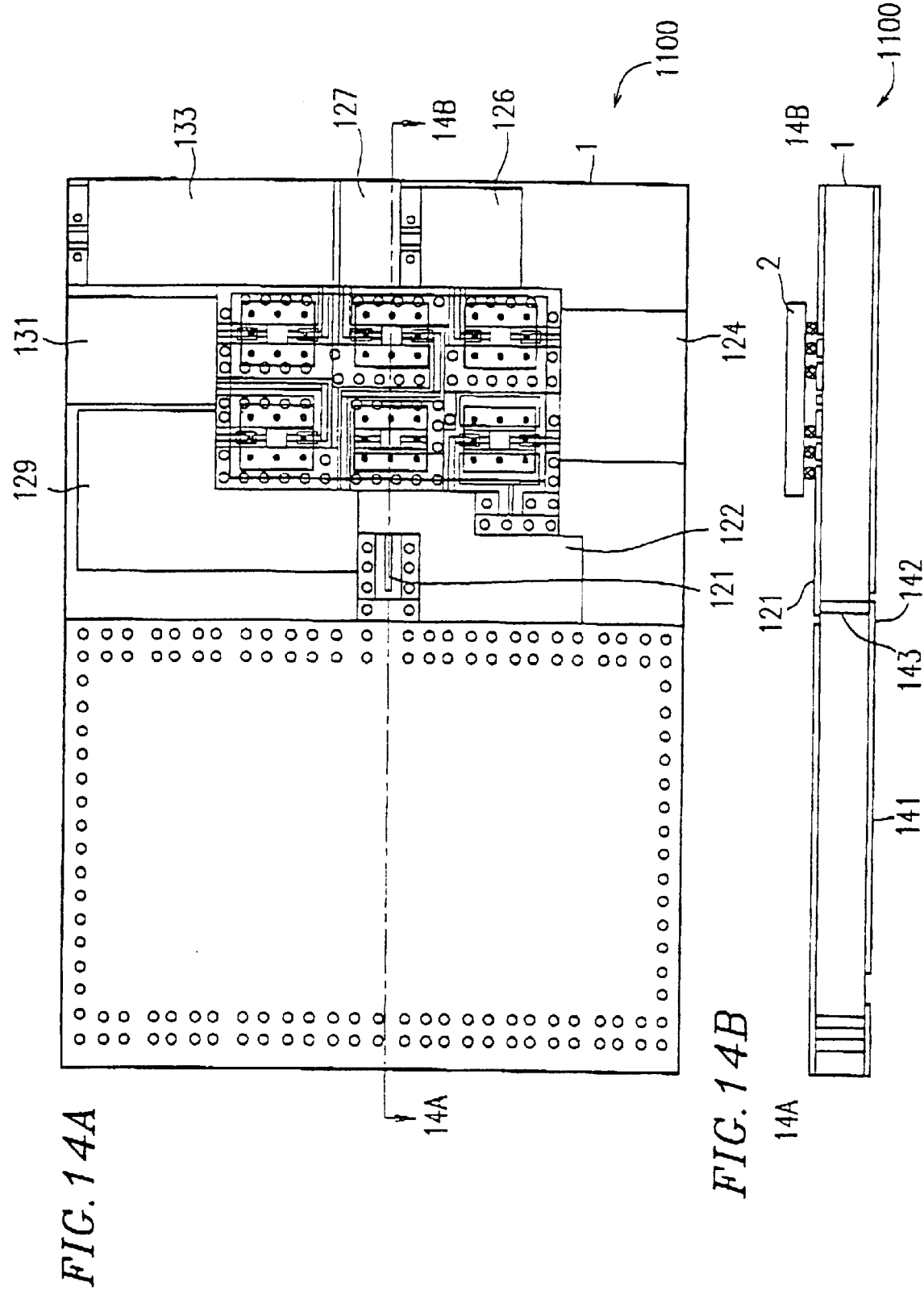
FIGS. 14A and 14B illustrate a structure of a microwave and millimeter wave device according to Example 11 of the present invention.

FIGS. 14A and 14B illustrate a microwave and millimeter wave device 1100 according to Example 11 of the present invention.

Figure 15:
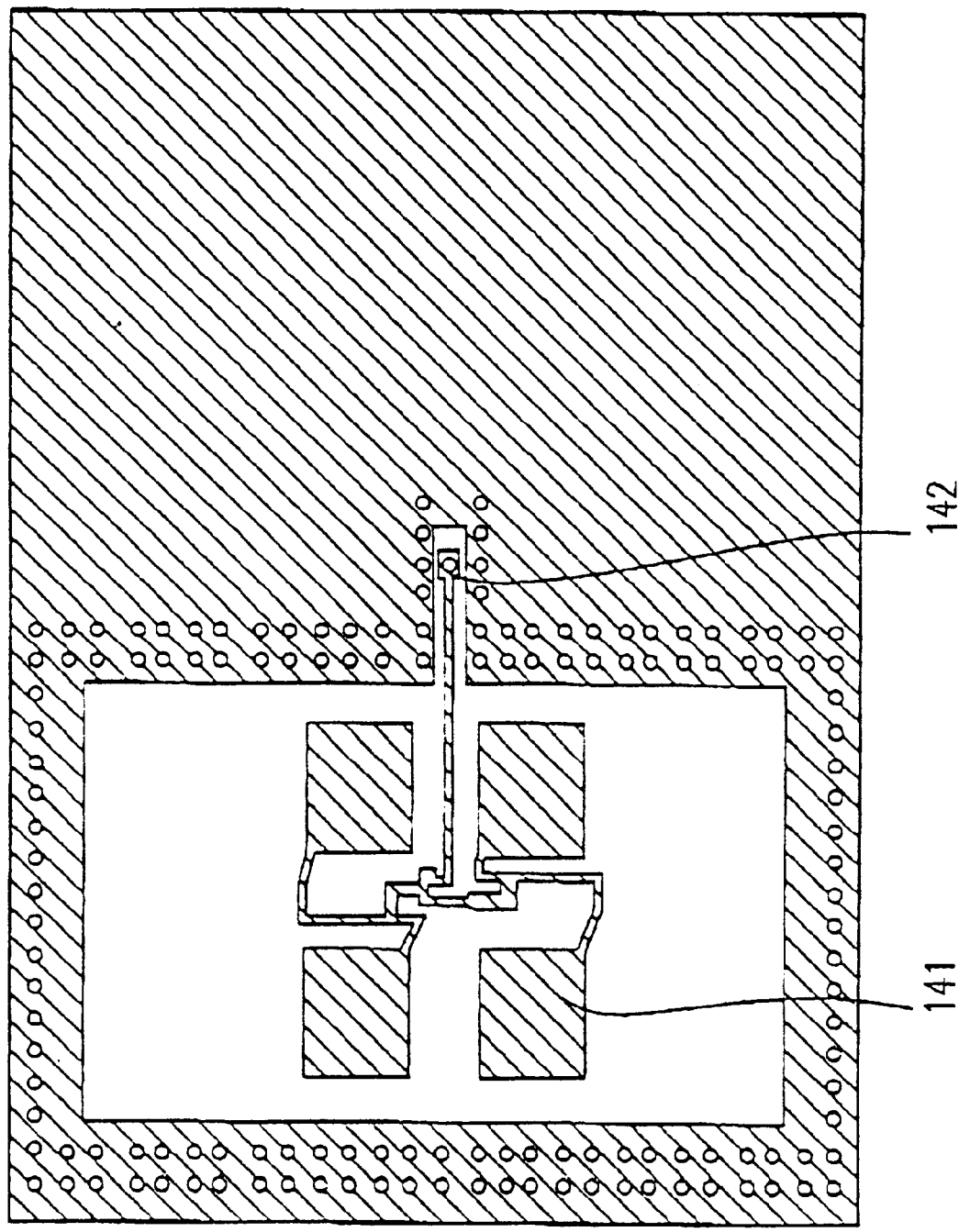
FIG. 15 illustrates a structure of a microwave and millimeter wave device according to Example 11 of the present invention.

FIG. 14A illustrates the microwave and millimeter wave device 1100 as viewed from the reverse side of the semiconductor substrate, in which the semiconductor substrate has been rendered transparent for detailed illustration of the connections between the active elements on the surface side of the semiconductor substrate and the dielectric substrate. FIG. 14B is a cross-sectional view taken along line 14A–14B in FIG. 14A, as viewed from the direction indicated by the arrows. FIG. 15 illustrates the dielectric substrate 1 as viewed from the reverse side thereof.

The microwave and millimeter wave device 1100 of Example 11 has substantially the same structure as that of the microwave and millimeter wave device 900 of Example 9, but is different in that a planar antenna 141 is provided on the reverse side of the dielectric substrate 1.

The microwave and millimeter wave device 1100 of Example 11 includes the planar antenna 141 on the reverse side of the dielectric substrate 1, and an end of a signal line which is extracted from the planar antenna 141 and is converted to a coplanar line has a power supply portion 142. On the surface side of the dielectric substrate 1, the input terminal 121 of the down converter as described above in Example 9 is extracted by a coplanar line from the input matching circuit/power supply circuit 122, and is connected to the power supply portion 142 of the planar antenna 141 via a through hole 143.

A high frequency signal from the outside of the device 1100 is incident upon the planar antenna 141, and is input to an input matching circuit/power supply circuit 122 on the surface side of the dielectric substrate via the through hole 143. Other than this, the operation of the device 1100 is substantially the same as that described in Example 9, and thus will not further be described.

By providing the planar antenna 141 on the reverse side of the dielectric substrate 1, it is possible to realize a very small microwave and millimeter wave device. It is also possible to connect the planar antenna to the high frequency circuit by the shortest distance. Thus, the loss of the high frequency signal is reduced.

Example 11 provides an exemplary microwave and millimeter wave device 1100 which receives a high frequency signal through the planar antenna 141 and converts the high frequency signal to an intermediate frequency signal. Conversely, the same principle can be applied to provide a microwave and millimeter wave device which converts an intermediate frequency signal to a high frequency signal and outputs the converted signal through a planar antenna.

EXAMPLE 12

Figure 16:
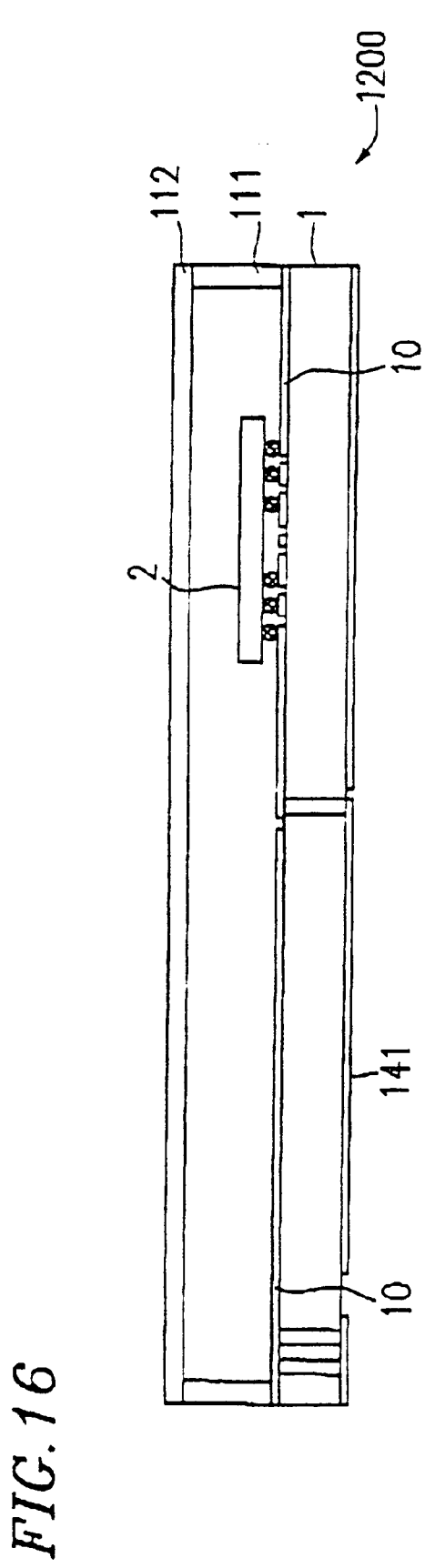
FIG. 16 illustrates a structure of a microwave and millimeter wave device according to Example 12 of the present invention.

FIG. 16 is a cross-sectional view illustrating a microwave and millimeter wave device 1200 according to Example 12 of the present invention.

The microwave and millimeter wave device 1200 of Example 12 has substantially the same structure as that of the microwave and millimeter wave device 1100 of Example 11, but is different in that the semiconductor substrate is covered with a frame body and a lid as in Example 8.

Specifically, in the microwave and millimeter wave device 1200 of the present example, the frame body 111 of metallized side walls is provided along the periphery of the dielectric substrate 1. Moreover, the metallized lid 112 is provided on the frame body 111 so as to cover the semiconductor substrate 2. The grounding conductor portions 10 on the surface side of the dielectric substrate 1 are physically and electrically connected to the frame body 111, which in turn is physically and electrically connected to the lid 112.

When the planar antenna 141 is provided on the reverse side of the dielectric substrate 1, the problem of unwanted wave radiation onto and from the surface side of the dielectric substrate 1 has to be addressed. In Example 12, the radiation onto or reflection from the device 1200 can be prevented by the frame body 111 and the lid 112.

EXAMPLE 13

FIGS. 17A and 17B illustrate a microwave and millimeter wave device 1300 according to Example 13 of the present invention.

FIG. 17A illustrates the microwave and millimeter wave device 1300 as viewed from the reverse side of the semiconductor substrate, in which the semiconductor substrate has been rendered transparent for detailed illustration of the connections between the active elements on the surface side of the semiconductor substrate and the dielectric substrate. FIG. 17B is a cross-sectional view taken along line 17A–17B in FIG. 17A, as viewed from the direction indicated by the arrows.

The microwave and millimeter wave device 1300 of the present example has substantially the same structure as that of the microwave and millimeter wave device 1000 of Example 10, but is different in that the dielectric substrate 1 includes the first dielectric layer 101, the intermediate conductor layer 102 and the second dielectric layer 103.

Specifically, in the microwave and millimeter wave device 1300 of Example 13, the first dielectric layer 101, the intermediate conductor layer 102 and the second dielectric layer 103 are deposited as the dielectric substrate 1. The intermediate conductor layer 102 is provided with a slot coupling hole 171. A signal line formed of a microstrip line is provided on the reverse side of the second dielectric layer 103. Moreover, a microstrip line 172 is provided to extend to an input matching circuit/power supply circuit on the surface side of the first dielectric layer 101. The end of the microstrip line 172 is electromagnetically coupled, for a desired frequency, to a signal line 173 on the reverse side of the second dielectric layer 103 via the slot coupling hole 171. The signal line 173 is connected to an external connection terminal 174.

When the coplanar line on the surface side of the dielectric substrate is connected with the coplanar line on the reverse side thereof via a through hole as in Example 10, the loss increases as the frequency increases since the through hole has a high impedance. However, by coupling the microstrip line on the surface side of the first dielectric layer 101 with the microstrip line on the reverse side of the second dielectric layer 103 via a slot coupling hole as in Example 13, a signal can be transmitted without loss.

EXAMPLE 14

Figures 18A, 18B:
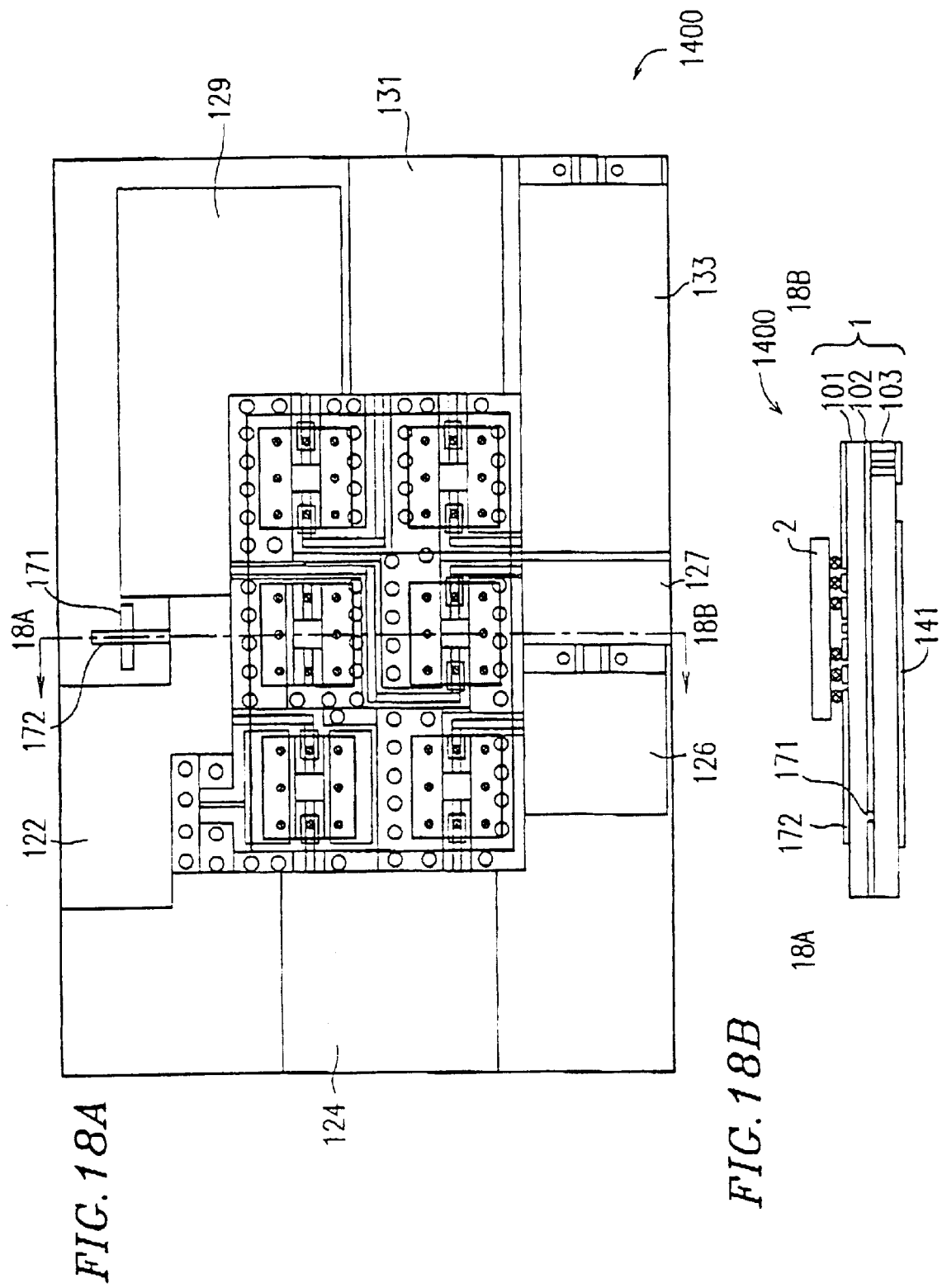
FIGS. 18A and 18B illustrate a structure of a microwave and millimeter wave device according to Example 14 of the present invention.

FIGS. 18A and 18B illustrate a microwave and millimeter wave device 1400 according to Example 14 of the present invention.

Figure 19:
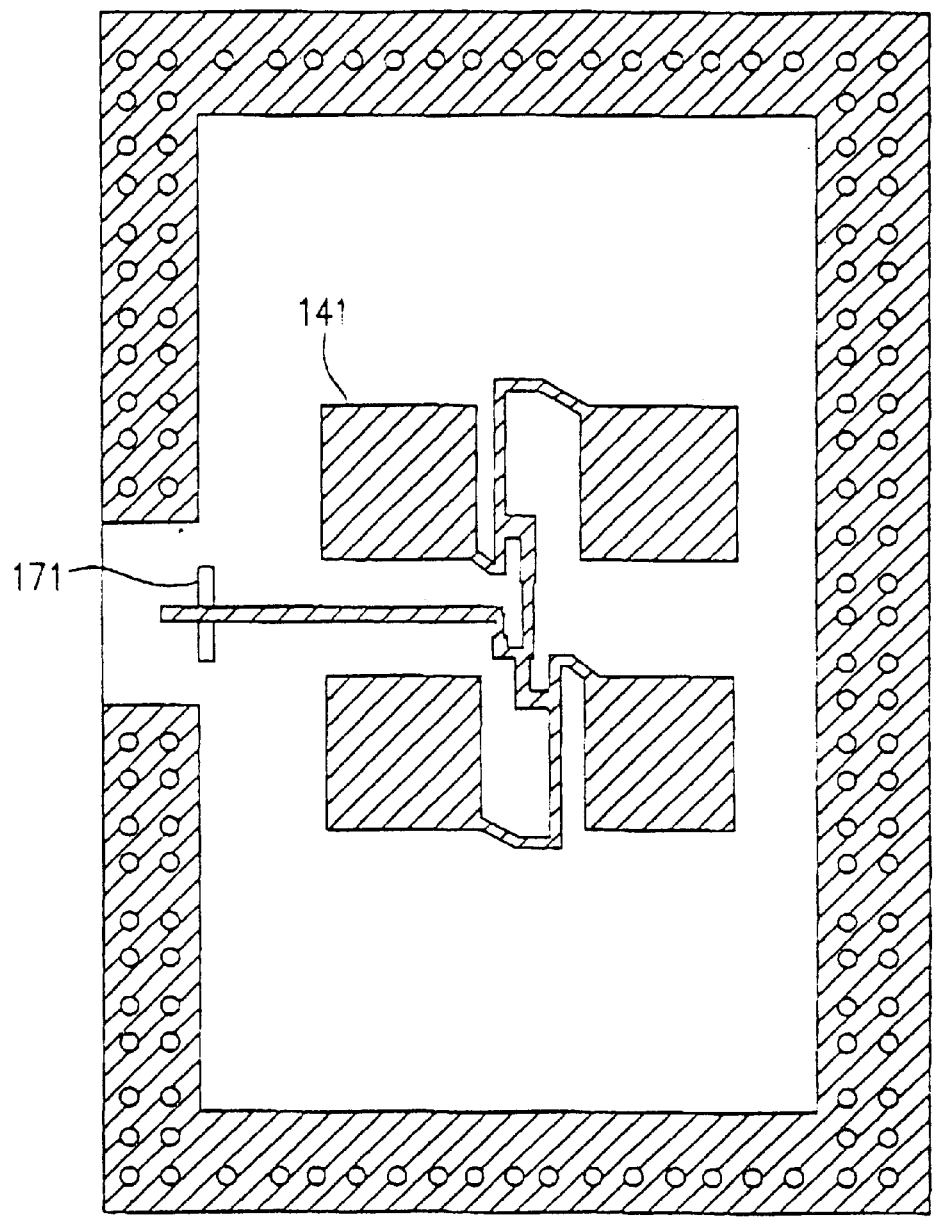
FIG. 19 illustrates a structure of a microwave and millimeter wave device according to Example 14 of the present invention.

FIG. 18A illustrates the microwave and millimeter wave device 1400 as viewed from the reverse side of the semiconductor substrate, in which the semiconductor substrate has been rendered transparent for detailed illustration of the connections between the active elements on the surface side of the semiconductor substrate and the dielectric substrate. FIG. 18B is a cross-sectional view taken along line 18A–18B in FIG. 18A, as viewed from the direction indicated by the arrows. FIG. 19 illustrates the second dielectric layer 103 as viewed from the reverse side thereof.

The microwave and millimeter wave device 1400 of Example 14 has substantially the same structure as that of the microwave and millimeter wave device 1300 of Example 13, but is different in that the planar antenna 141 is provided on the reverse side of the dielectric substrate 1.

Specifically, the microwave and millimeter wave device 1400 according to Example 14 includes the planar antenna 141 provided on the reverse side of the second dielectric layer 103. A terminal of the planar antenna 141 is electromagnetically coupled, for a desired frequency, to the microstrip line 172 of the first dielectric layer 101 via the slot coupling hole 171. The microstrip line 172 on the surface side of the first dielectric layer 101 is connected to the input matching circuit/power supply circuit 122.

A high frequency external signal from the outside of the device 1400 is incident upon the planar antenna 141 on the reverse side of the second dielectric layer 103, and is input to the input matching circuit/power supply circuit 122 on the surface side of the first dielectric layer 101 via the slot coupling hole 171. Other than this, the operation of the device 1400 is substantially the same as that described in Example 9, and thus will not further be described.

By providing the planar antenna 141 on the reverse side of the second dielectric layer 103, it is possible to realize a very small microwave and millimeter wave device. It is also possible to connect the planar antenna 141 to the high frequency circuit provided on the first dielectric layer 101 by the shortest distance. This reduces the loss of the high frequency signal.

Example 14 provides an exemplary microwave and millimeter wave device 1400 which receives a high frequency signal through the planar antenna and converts the high frequency signal to an intermediate frequency signal. Alternatively, the same principle can be applied to provide a microwave and millimeter wave device which converts an intermediate frequency signal to a high frequency signal and outputs the converted signal through a planar antenna.

EXAMPLE 15

Figure 20:
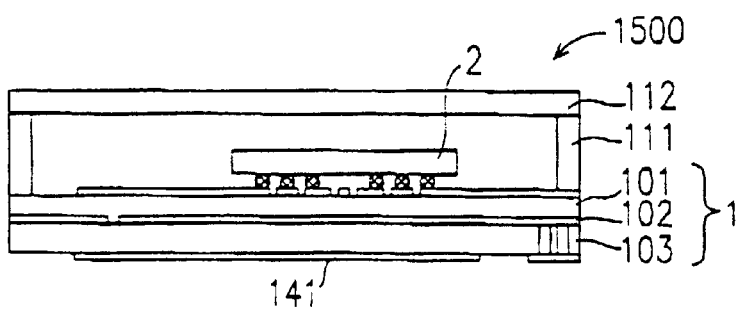
FIG. 20 illustrates a structure of a microwave and millimeter wave device according to Example 15 of the present invention.
Figures 22A, 22B:
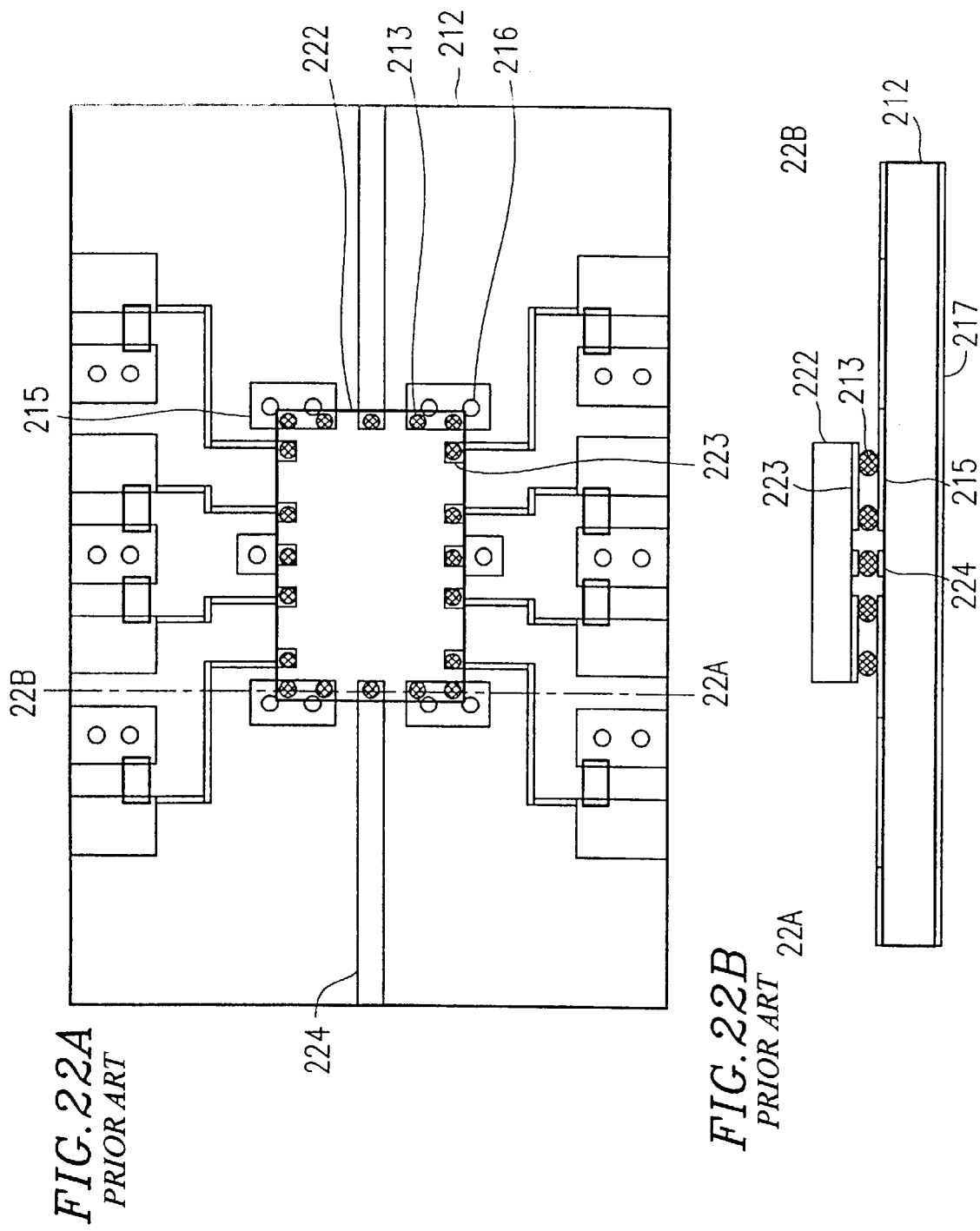
FIGS. 22A and 22B are schematic diagrams illustrating a device including an MMIC mounted thereon as an exemplary conventional microwave and millimeter wave device.

FIG. 20 is a cross-sectional view illustrating a microwave and millimeter wave device 1500 according to Example 15 of the present invention.

The microwave and millimeter wave device 1500 of Example 15 has substantially the same structure as that of the microwave and millimeter wave device 1400 of Example 14, but is different in the following points. The frame body 111 of metallized side walls is provided along the periphery of the dielectric substrate 1. Moreover, the metallized lid 112 is provided on the frame body 111 so as to cover the semiconductor substrate 2. The grounding conductor portions 10 on the surface side of the dielectric substrate 1 are physically and electrically connected to the frame body 111, which in turn is physically and electrically connected to the lid 112.

When the planar antenna 141 is provided on the reverse side of the second dielectric layer 103, the problem of unwanted wave radiation onto and from the surface side of the first dielectric layer 101 has to be addressed. In Example 15, the radiation onto or reflection from the device 1500 can be prevented by the frame body 111 and the lid 112.

EXAMPLE 16

Figures 23A, 23B:
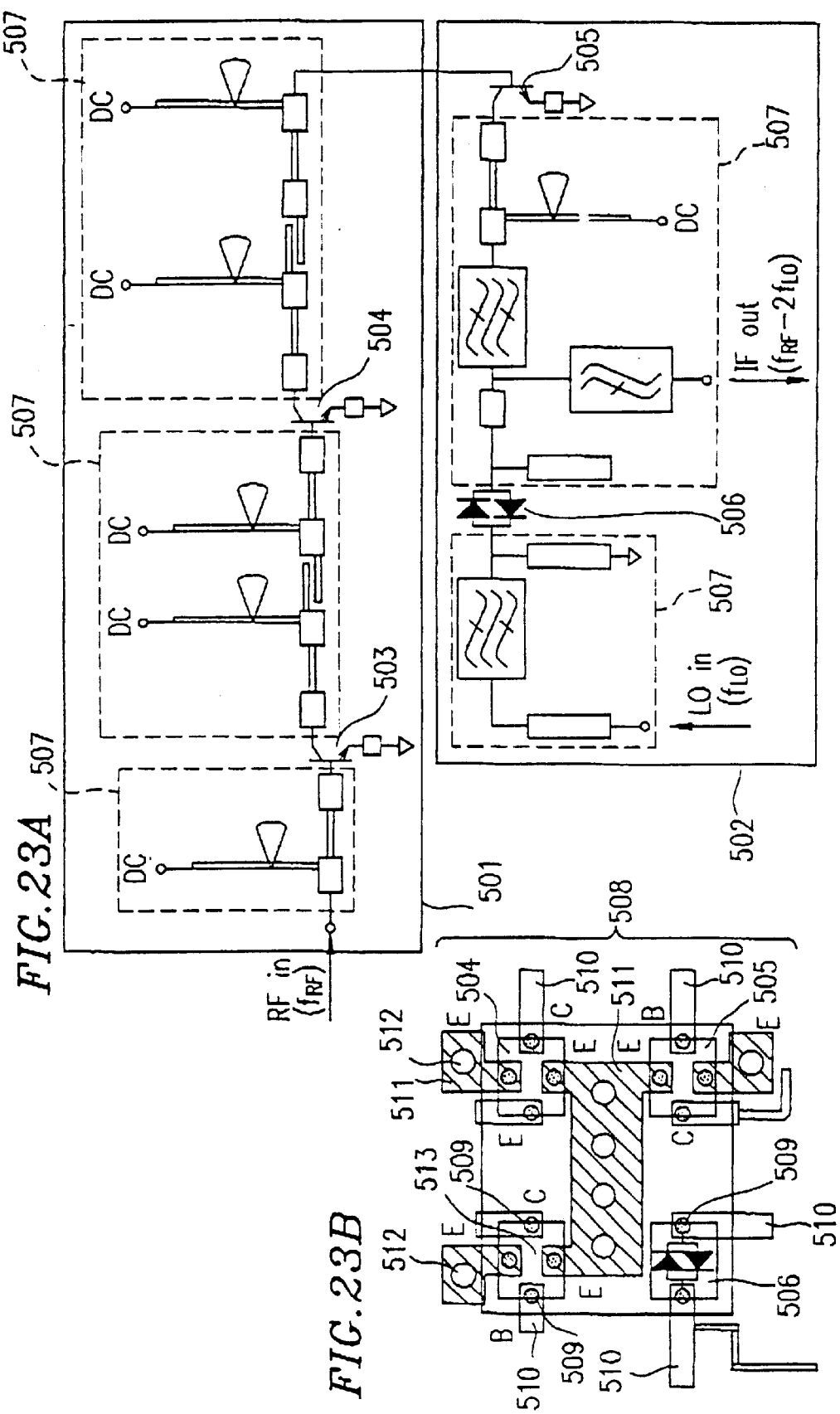
FIG. 23A illustrates a circuit diagram of a microwave and millimeter wave device according to Example 16 of the present invention.
FIG. 23B illustrates a structure of a microwave and millimeter wave device according to Example 16 of the present invention.
Figure 23C:
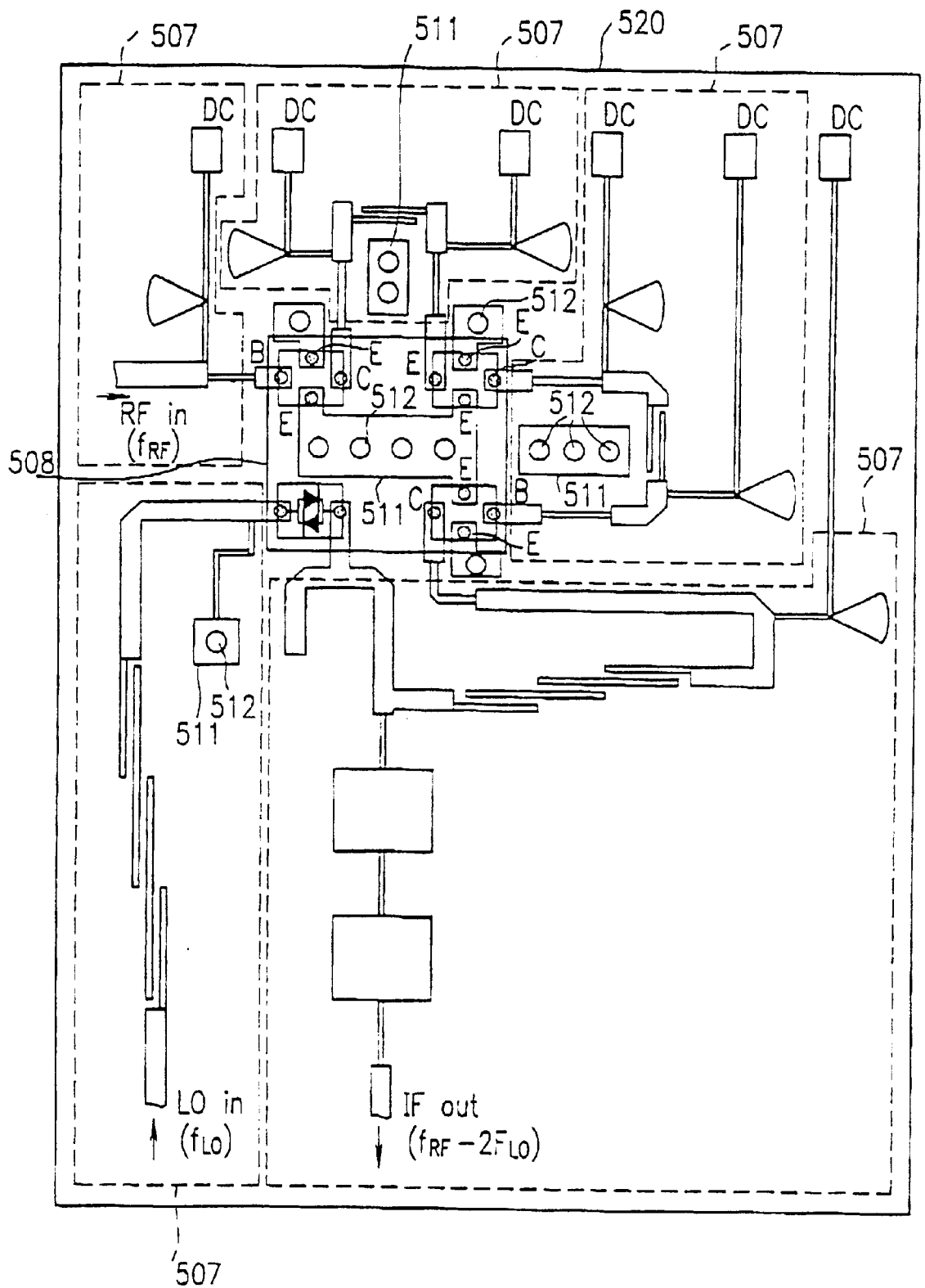
FIG. 23C illustrates a circuit layout of a microwave and millimeter wave device according to Example 16 of the present invention.

FIGS. 23A, 23B and 23C illustrate an exemplary frequency down converter using a plurality of transistors and a diode pair provided on a semiconductor substrate, as a microwave and millimeter wave device according to Example 16 of the present invention.

FIG. 23A illustrates a circuit diagram showing the entire circuit of the microwave and millimeter wave device of the present example which includes a low-noise amplifier 501 and a frequency mixer 502. FIG. 23B illustrates a connection between a function element array 508, including transistors and diodes provided on the semiconductor substrate, and a dielectric substrate. The function element array 508 includes transistors 503, 504 and 505 and a diode pair 506, illustrated in FIG. 23A. Furthermore, FIG. 23C is a circuit layout diagram showing the entire circuit, illustrating a layout diagram of the function element array 508 on the semiconductor substrate, together with a layout diagram of passive circuits 507 on a dielectric substrate 520. Like reference numerals denote like elements throughout FIGS. 23A to 23C.

Referring to the circuit diagram of FIG. 23A, the low-noise amplifier 501 includes the passive circuits 507, formed of transmission lines on the dielectric substrate, and the transistors 503, 504 and 505. The frequency mixer 502 includes a band pass filter, a low pass filter, the passive circuits 507 formed of transmission lines, and the diode pair 506, which are provided on the dielectric substrate. Referring to FIG. 23B, the function element array 508 on the semiconductor substrate is formed of four elements in total; that is, the microwave transistors 503, 504 and 505 and the diode pair 506. Respective base terminals B and collector terminals C of the microwave transistors 503 to 505 and an input/output terminal of the diode pair 506 are physically and electrically connected to respective connection terminals 510 on the dielectric substrate via metal bumps 509. In addition, emitter terminals E on the semiconductor substrate are physically and electrically connected to respective grounding terminals 511 on the dielectric substrate via the metal bumps 509. Moreover, the grounding terminals 511 are connected to respective grounding terminals (not shown) provided on the reverse side of the dielectric substrate.

The semiconductor substrate and the dielectric substrate which are physically and electrically connected to each other via the metal bumps 509 by a flip-chip connection method, as illustrated in FIG. 23B, can be integrated with the passive circuits 507 provided on the dielectric substrate 520, as illustrated in FIG. 23C, so as to implement a frequency down converter. In particular, a high frequency input RF in having a frequency $f_{RF}$ which is input to the low-noise amplifier 501 and a local oscillation signal LOin having a frequency $f_{LO}$ which is input to the frequency mixer 502 are used to generate and output an intermediate frequency signal $IF_{out}$ having a frequency corresponding to $f_{RF}-2f_{LO}$.

The dielectric substrate may be a multilayer thin substrate provided on the semiconductor substrate. This is suitable for production of a device which is operated at a high frequency because the substrate can be subjected to fine processing.

Figure 24A:
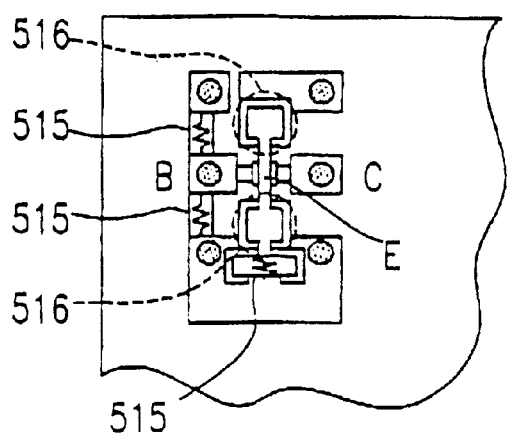
FIGS. 24A($a$) and 24A($b$) illustrate another circuit configuration which can be included in a microwave and millimeter wave device according to Example 16 of the present invention.
Figure 24A:
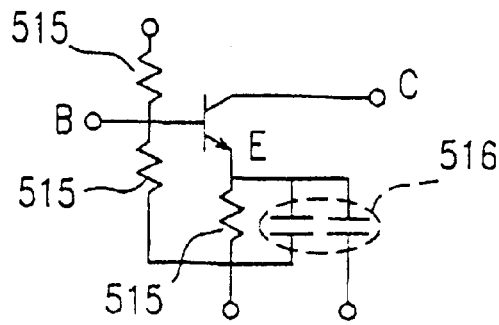

In the above-described example, the microwave transistors 503 to 505 and the diode pair 506 are provided on the semiconductor substrate. Alternatively, a plurality of function blocks may be arranged on the semiconductor substrate, wherein each of the function blocks is obtained by integrating transistors and a bias circuit on the semiconductor substrate, as illustrated in FIGS. 24A($a$) and 24A($b$). In such a case, the elements of the bias circuit, such as a resistor 515 and a MIM (Metal Insulate Metal) capacitor 516, can be provided in the immediate vicinity of a microwave transistor on the semiconductor substrate. Thus, a parasitic capacitance component or a parasitic inductance component is unlikely to occur, thereby realizing a stable circuit operation.

While the present example has illustrated an exemplary frequency down converter including the low-noise amplifier 501 and the frequency mixer 502, the present invention is not limited to such a structure.

Figure 24B:
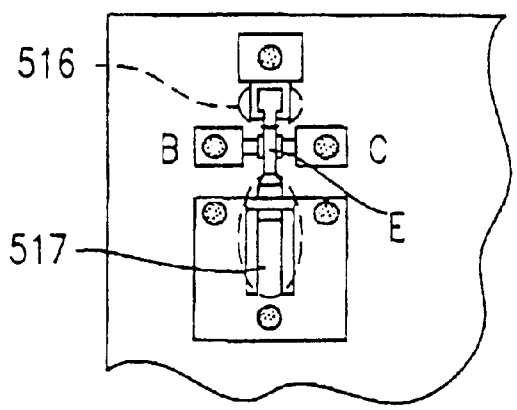
FIGS. 24B($a$) and 24B($b$) illustrate still another circuit configuration which can be included in a microwave and millimeter wave device according to Example 16 of the present invention.
Figure 24B:
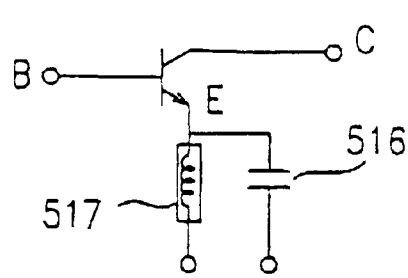
Figure 24C:
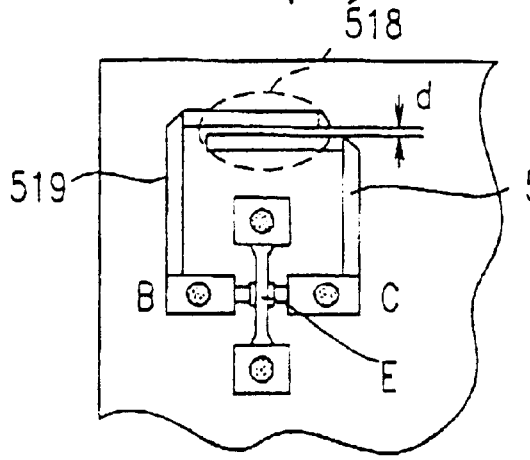
FIGS. 24C($a$) and 24C($b$) illustrate still another circuit configuration which can be included in a microwave and millimeter wave device according to Example 16 of the present invention.
Figure 24C:
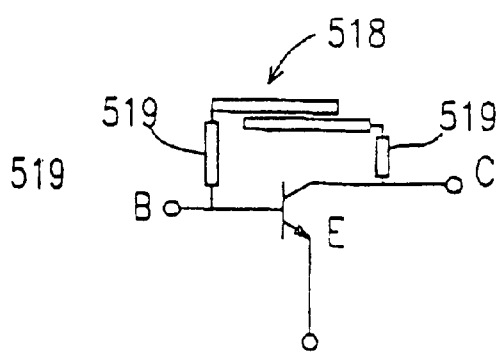

For example, in order to provide an oscillator for use in a microwave band and a millimeter wave band, a feedback control is required for the transistors. In such a case, a capacitor element 516, a short stub 517 (functioning as an inductor element), or the like, may be provided in the immediate vicinity of a microwave transistor, as illustrated in FIGS. 24B($a$) and 24B($b$), thereby providing a function block including a series feedback circuit. Alternatively, transmission lines 519 and coupling lines 518 may be provided in the immediate vicinity of a transistor, as illustrated in FIGS. 24C($a$) and 24C($b$), thereby providing a function block including a parallel feedback circuit.

The size of these feedback circuits decreases as the operating frequency increases. Therefore, in the case of a series feedback circuit as illustrated in FIGS. 24B($a$) and 24B($b$), elements having low capacitance or inductance values are required as the capacitor element 516 and the inductor element (short stub) 517. In the case of a parallel feedback circuit as illustrated in FIGS. 24C($a$) and 24C($b$), the coupling lines 518 are required to have a small coupling distance d.

It is generally difficult to provide elements satisfying these requirements on a dielectric substrate such as a ceramic substrate in view of the processing techniques required therefor. According to the present invention, however, such elements can be provided on a semiconductor substrate by micro-processing based on a semiconductor processing technique. For example, the feedback circuit as described above can be simultaneously formed while the microwave transistors 503 to 505 are formed on the semiconductor substrate.

It is also possible to use a plurality of such function blocks each of which is obtained by integrating transistors and a feedback circuit. In such a case, since the feedback circuit is provided in the immediate vicinity of a microwave transistor, a parasitic capacitance component, a parasitic inductance component, a parasitic line component, or the like, is unlikely to occur, thereby realizing a stable circuit operation.

In the frequency down converter described above, only the passive circuits 507 are provided on the dielectric substrate. However, an active circuit may be provided alternatively or additionally. The output section of the frequency down converter circuit outputs the signal $IF_{out}$ within the intermediate frequency band (which has been obtained by down converting the frequency thereof to a lower frequency) as described above. Therefore, for example, it is possible to provide an active circuit such as a hybrid IC or an MMIC by a combination of single transistors, in which an intermediate frequency signal processing circuit, a frequency conversion circuit for converting a signal to a base band signal, or the like, has been packaged.

EXAMPLE 17

An exemplary frequency multiplier using a plurality of transistors will be described as a microwave and millimeter wave device according to Example 17 of the present invention, with reference to FIGS. 25A to 25E. Elements in FIGS. 25A to 25E having like reference numerals to those shown in FIGS. 23A to 23C will not further be described.

Figure 25A:
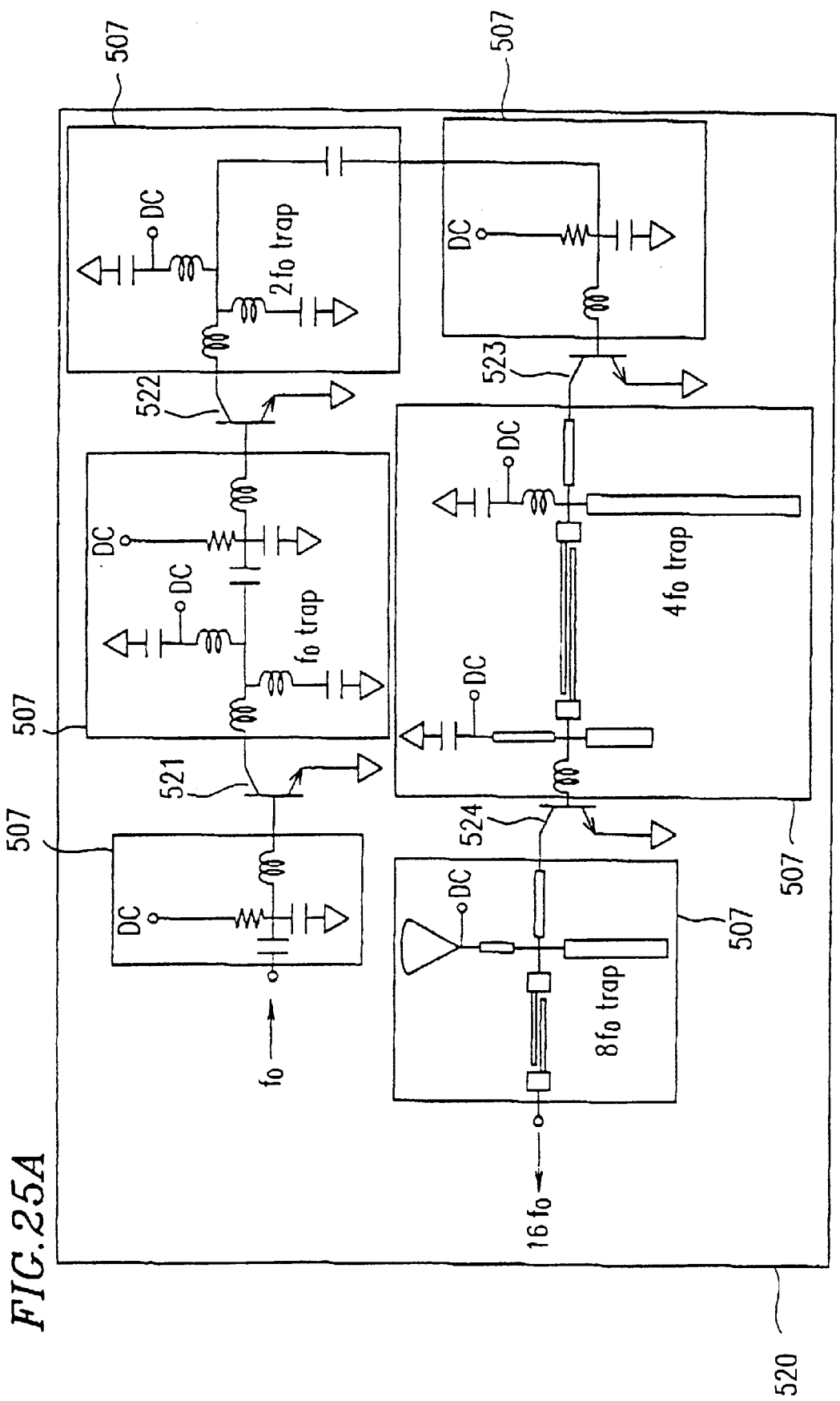
FIG. 25A illustrates a circuit diagram of a microwave and millimeter wave device according to Example 17 of the present invention.
Figure 25B:
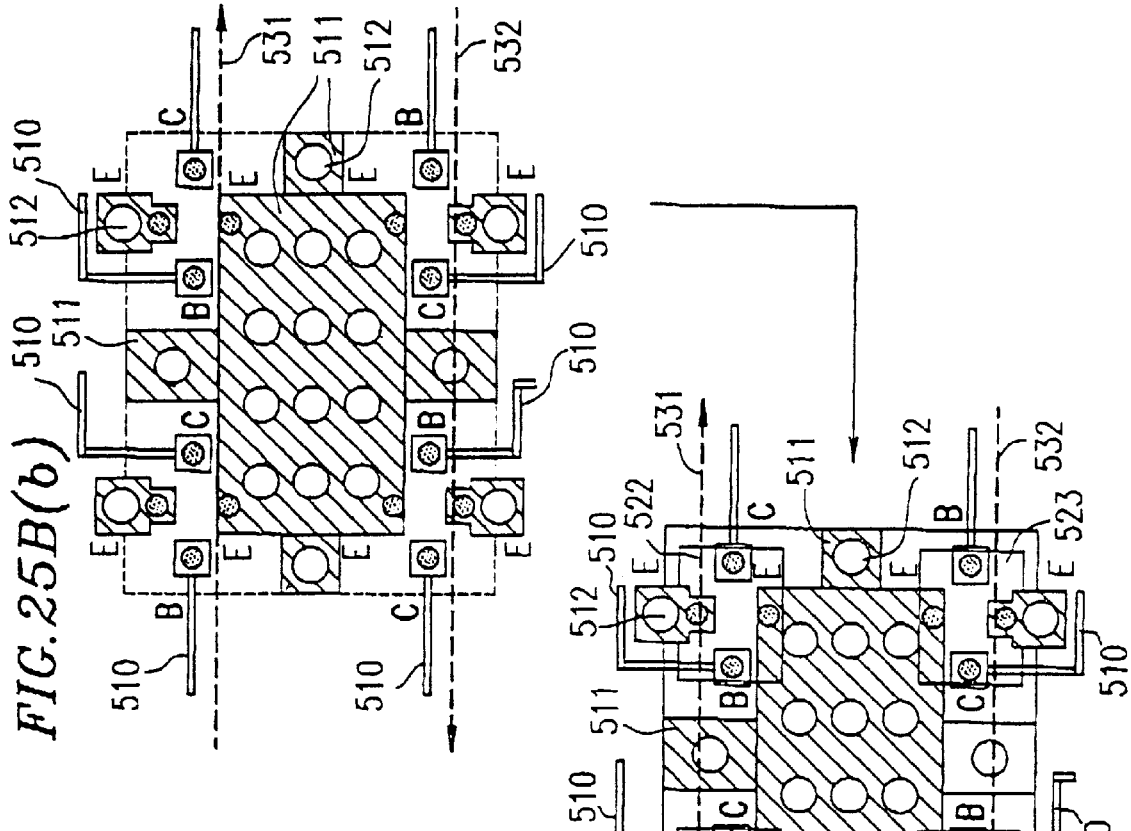
FIGS. 25B($a$), 25B($b$) and 25B($c$) illustrate a structure of a microwave and millimeter wave device according to Example 17 of the present invention.
Figure 25B:
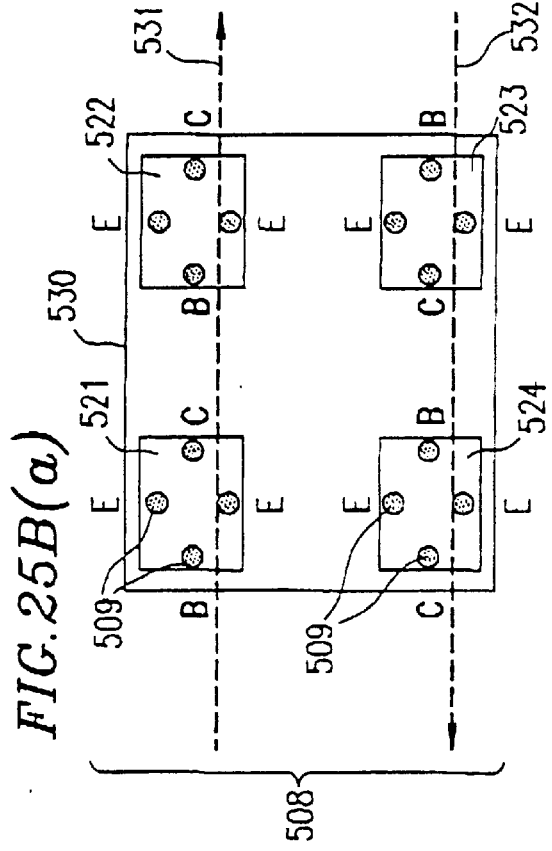
Figure 25B:
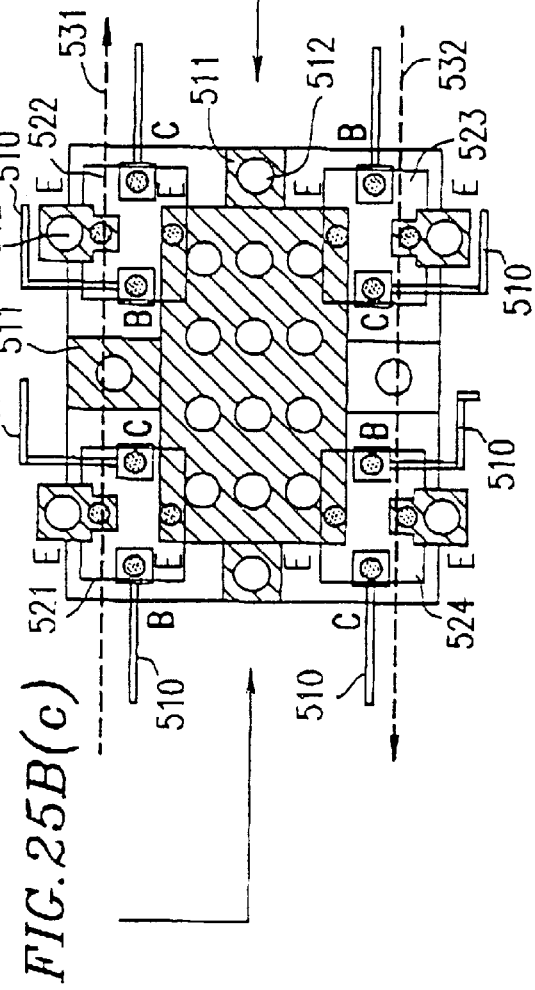

Referring to FIG. 25A illustrating a circuit diagram showing the entire circuit, a microwave and millimeter wave device of the present example includes four transistors 521, 522, 523 and 524 provided on a semiconductor substrate and the passive circuits 507 provided on the dielectric substrate 520. FIG. 25B(a) illustrates positioning of the metal bumps 509 with respect to the transistor array 508 including the transistors 521, 522, 523 and 524 on the semiconductor substrate. FIG. 25B(b) illustrates positioning of the input/output (connection) terminals 510, the grounding terminals 511, the metal bumps 509 and the via holes 512 with respect to the dielectric substrate. FIG. 25B(c) illustrates the semiconductor substrate and the dielectric substrate being integrated with each other. Moreover, FIGS. 25C(a) to 25C(c) and 25D(a) to 25D(c) respectively correspond to FIGS. 25B(a) 25B(b) and 25B(c), illustrating slightly different arrangements of the grounding terminals, the metal bumps, and the like, with respect to the transistor array 508. Furthermore, FIG. 25E is a circuit diagram showing the entire circuit, illustrating a layout diagram of the function element array 508 on a semiconductor substrate 503, together with a layout diagram of the passive circuits 507 on the dielectric substrate 520. Like reference numerals denote like elements throughout these figures. positioning of the metal bumps 509 with respect to the transistor array 508 including the transistors 521 to 524 on the semiconductor substrate. FIG. 25B(b) illustrates positioning of the input/output (connection) terminals 510, the grounding terminals 511, the metal bumps 509 and the via holes 512 with respect to the dielectric substrate. FIG. 25B(c) illustrates the semiconductor substrate and the dielectric substrate being integrated with each other. Moreover, FIGS. 25C(a) to 25C(c) and 25D(a) to 25D(c) respectively correspond to FIGS. 25B(a) to 25B(c), illustrating slightly different arrangements of the grounding terminals, the metal bumps, and the like, with respect to the transistor array 508. Furthermore, FIG. 25E is a circuit diagram showing the entire circuit, illustrating a layout diagram of the function element array 508 on a semiconductor substrate 503, together with a layout diagram of the passive circuits 507 on the dielectric substrate 520. Like reference numerals denote like elements throughout these figures.

Referring to the circuit diagram of FIG. 25A, the device of the present example which functions as the frequency multiplier includes the passive circuits 507 formed of transmission lines provided on the dielectric substrate and the transistors 521 to 524. A frequency $f_0$ of a given input signal is doubled in each of the transistors 521 to 524, finally providing an output signal having a frequency of $16 \cdot f_0$. For example, for an input signal having a frequency $f_0=2$ GHz, the output frequency will be 32 GHz.

The passive circuit 507 includes a circuit for realizing an efficient frequency multiplication by obtaining an impedance matching among the transistors 521 to 524, and a circuit for removing unnecessary waves. As illustrated in FIG. 25E, a semiconductors substrate 530 including the transistor array 508 provided thereon is integrated with the respective passive circuits 507 provided on the dielectric substrate via the metal bumps 509 by a flip-chip connection method, thereby implementing a frequency multiplier.

The grounding terminals 511 on the dielectric substrate are respectively connected to the grounding terminals (not shown) provided on the reverse side of the dielectric substrate via the via holes 512.

Referring to FIG. 25B(a), the transistor array 508 on the semiconductor substrate 530 includes the four transistors 521 and 524. The base, collector and emitter terminals B, C and E of each of the transistors 521 to 524 are physically and electrically connected via the metal bumps 509 to the input/output (connection) terminals 510 and the grounding terminals 511 on the dielectric substrate illustrated in FIG. 25B(b).

The four transistors 521 to 524 are arranged in two rows. For example, the transistors 521 and 522 may form one row and the other transistors 523 and 524 may form the other row. The transistors 521 and 522 of the first row are arranged in a direction indicated by an arrow 531, whereas the transistors 523 and 524 of the second row are arranged in the opposite direction, as indicated by an arrow 532. Due to such a structure where the input/output terminals of the transistors in the respective rows are arranged in opposite directions, it is possible to efficiently connect the transistors 521 to 524, thereby obtaining a smaller passive circuit which is more suitable for a high frequency operation.

As illustrated in FIGS. 25B(a) to 25B(c), for example, the only grounding terminals provided on the semiconductor substrate are the emitter terminals E, whereas the grounding terminals 511 are provided on the dielectric substrate. The grounding terminals 511 are provided on the dielectric substrate so as to generally surround the transistors 521 to 524. Such an arrangement ensured isolation from the mutual interference of the transistors 521 to 524.

Figure 25C:
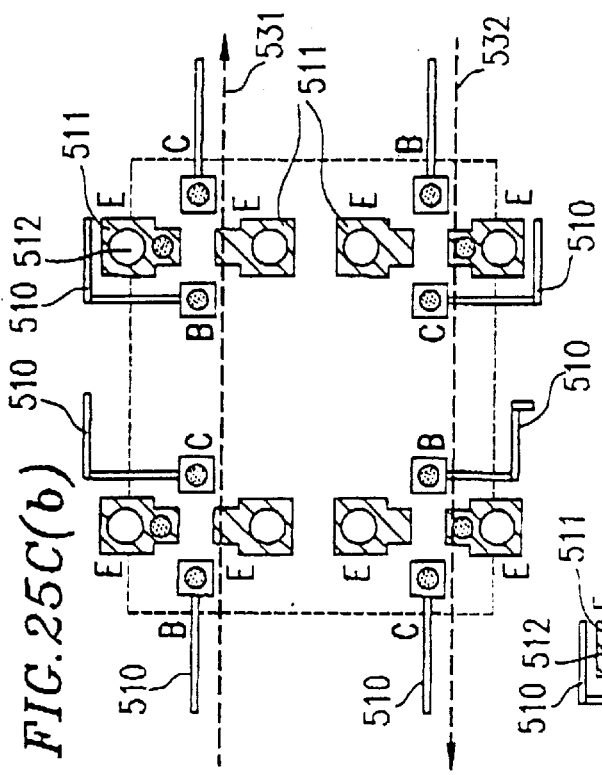
FIGS. 25C($a$), 25C($b$) and 25C($c$) illustrate another a structure of a microwave and millimeter wave device according to Example 17 of the present invention so as to corresponding to FIGS. 25B($a$), 25B($b$) and 25B($c$)
Figure 25C:
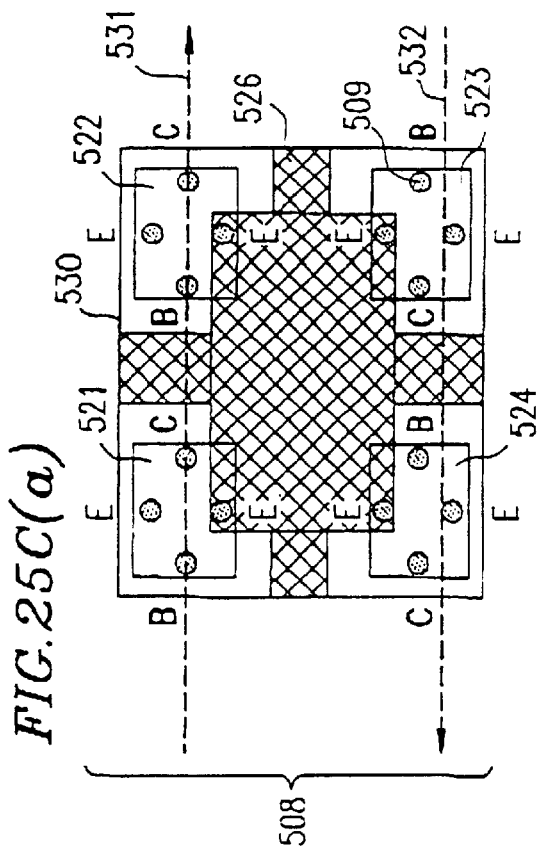
Figure 25C:
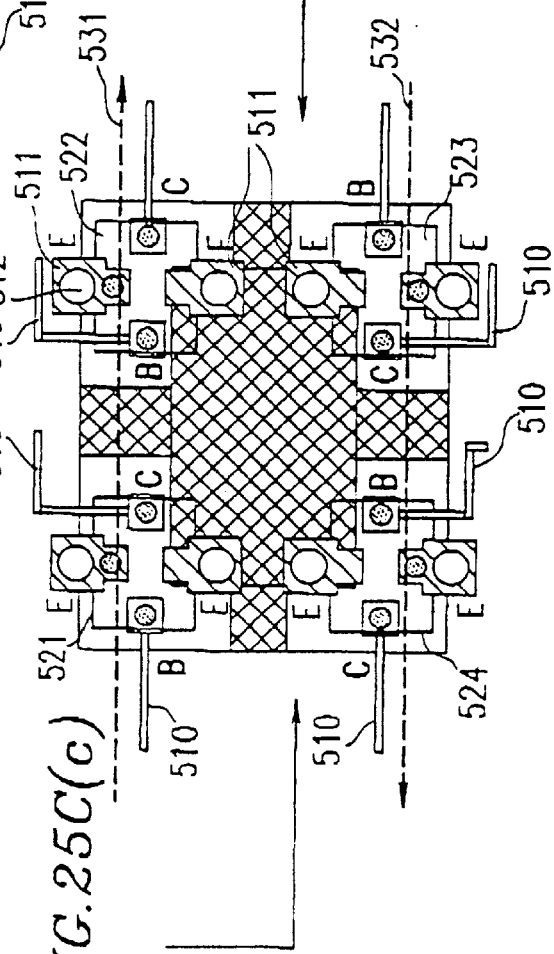

Alternatively, a further grounding terminal 526 may be provided additionally on the semiconductor substrate 530, as illustrated in FIG. 25C(a). The grounding terminal 526 is obtained by interconnecting an extending the emitter terminals E, and is shaped to generally surround the transistors 521, 522, 523 and 524. On the contrary, the grounding terminals 511 on the dielectric substrate are provided independently for the respective transistors 521, 522, 523 and 524, as illustrated in FIG. 25C(b). The resulting structure as illustrated in FIG. 25C(c) ensures isolation from the mutual interference of the transistors 521, 522, 523 and 524 and provides a heat radiation effect.

Figure 25D:
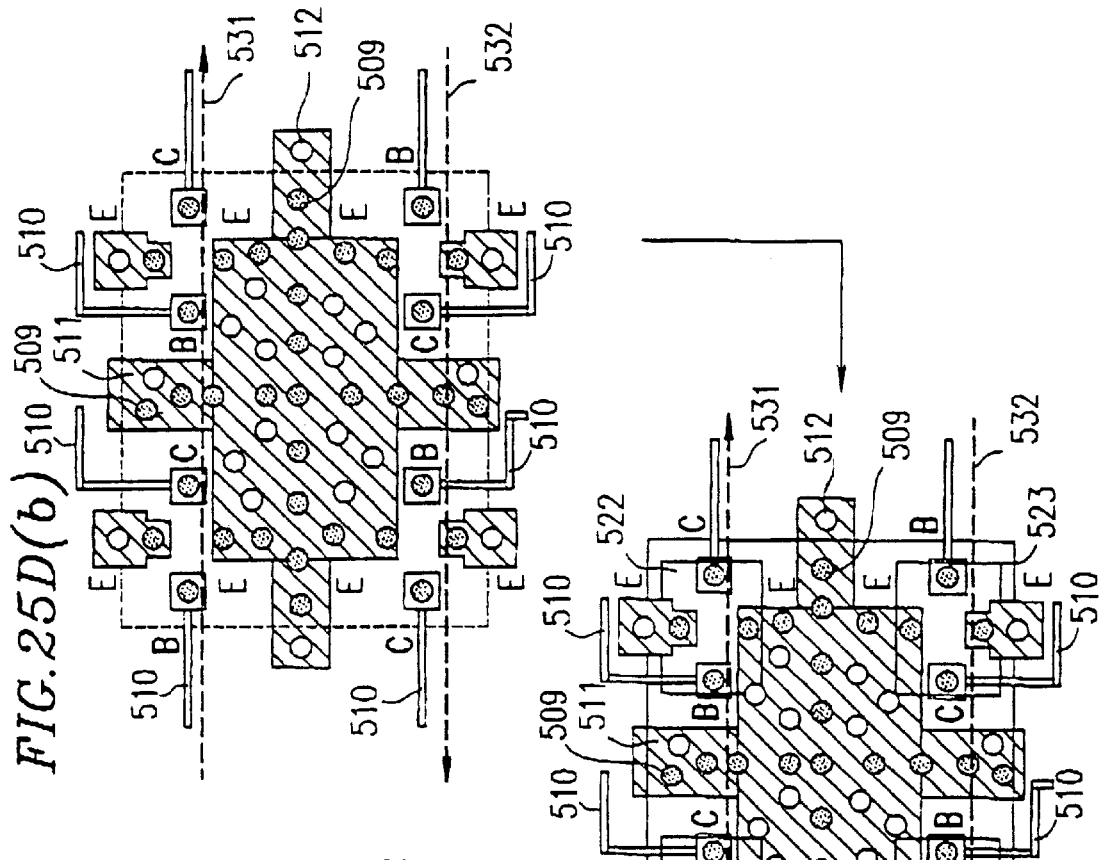
FIGS. 25D($a$), 25D($b$) and 25D($c$) illustrate another a structure of a microwave and millimeter wave device according to Example 17 of the present invention so as to corresponding to FIGS. 25B($a$), 25B($b$) and 25B($c$)
Figure 25D:
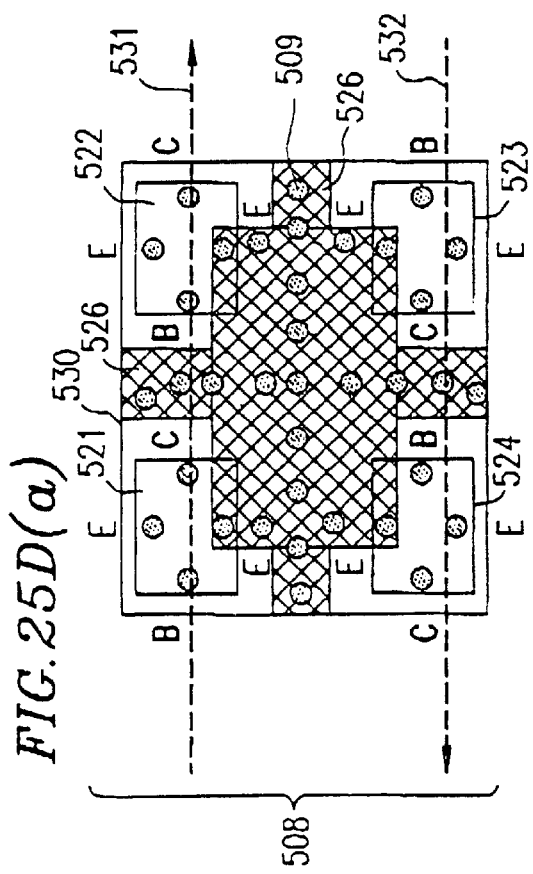
Figure 25D:
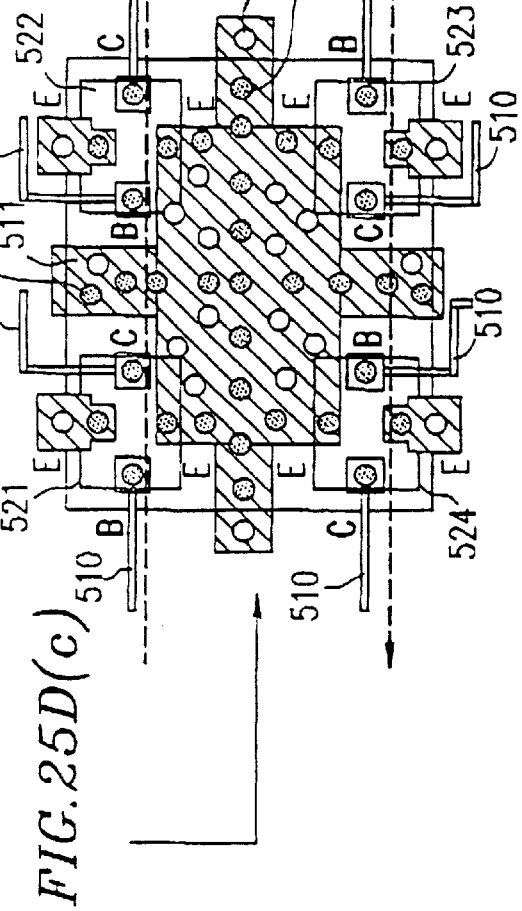
Figure 25E:
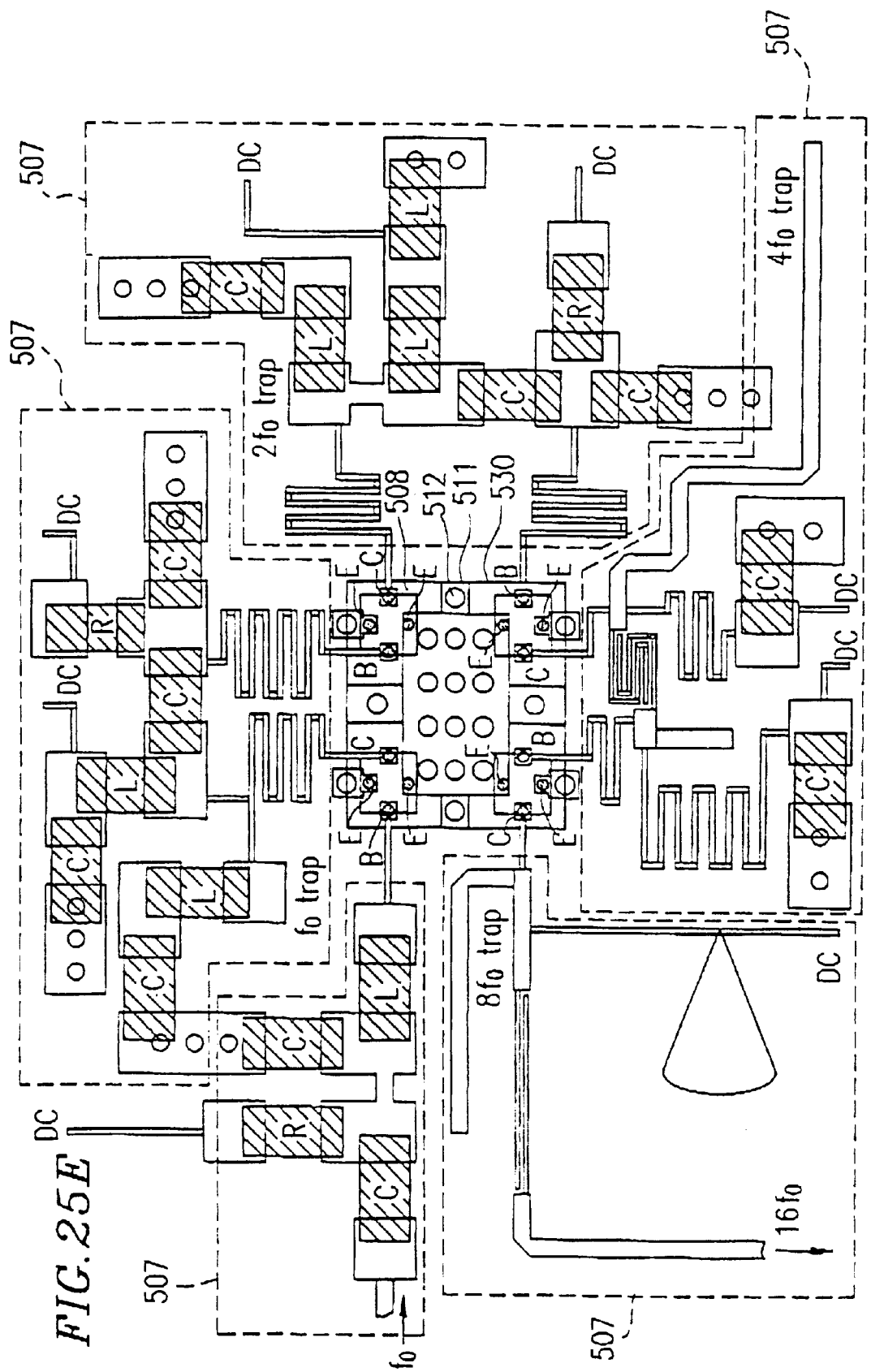
FIG. 25E illustrates a circuit layout of a microwave and millimeter wave device according to Example 17 of the present invention.

In the structure illustrated in FIG. 25D(a) to 25D(c), the grounding terminal 526 (see FIG. 25D(a)) provided on the semiconductor substrate 530 and the grounding terminals 511 (see FIG. 25D(b)) provided on the dielectric substrate are connected via the metal bumps 509. The transistors 521 to 524 are 3-dimensionally surrounded by the metal bumps 509 and the grounding terminals 511 and 526 together (see FIG. 25D(c)). This ensures isolation from the mutual interference of the transistors 521 to 524 and provides an increased heat radiation effect, while removing unnecessary electromagnetic wave modes existing between the semiconductor substrate and the dielectric substrate.

As described above, the present invention provides a small, low-cost microwave and millimeter wave device which allows the development time to be shortened and has good passive circuit characteristics. Moreover, the mounting area can be increased, thereby increasing the mounting strength of the microwave and millimeter wave device. Furthermore, it is possible to improve the electrical isolation between the active elements, and to reduce the inductance between the grounding terminals of the respective active elements. By providing a conductor on the reverse side of the semiconductor substrate and connecting the conductor to the surface side of the semiconductor substrate via a through hole, it is possible to improve the radiation characteristic of the active element.

Moreover, the present invention makes it possible to stabilize the ground potentials of the passive element and the active element of the microwave and millimeter wave device, thereby stabilizing the characteristic of the microwave and millimeter wave. Furthermore, by providing the dielectric substrate which includes a plurality of layers, it is possible to increase the mechanical strength of the dielectric substrate.

Moreover, according to the present invention, a microwave and millimeter wave device can be provided using a function element block array including an active element and a diode element so as to accommodate any circuits ranging from a microwave band circuit to a millimeter wave band circuit. Since the micro-processing based on a semiconductor processing technique may be applied onto the semiconductor substrate, a minute passive circuit required for a high frequency band can be provided in the immediate vicinity of an active element, thereby realizing a stable circuit operation. In addition, since a dielectric substrate having a small dielectric loss such as a ceramic substrate can be used as interconnect for connecting respective transistors, interconnection with a low loss in the millimeter wave band is realized, thereby providing a high gain, high efficiency circuit. Furthermore, while the circuit is thermally stabilized, sufficient isolation from the mutual interference of the transistors can be ensured, and unnecessary electromagnetic wave modes existing between the semiconductor substrate and dielectric substrate can be removed.

Various other modifications will be apparent to and can be readily made by those skilled in the art without departing from the scope and spirit of this invention. Accordingly, it is not intended that the scope of the claims appended hereto be limited to the description as set forth herein, but rather that the claims be broadly construed.

What is claimed is:

1. A microwave and millimeter wave device, comprising:

a dielectric substrate including at least one signal line, a passive circuit and a first grounding conductor portion which are formed on a surface side of the dielectric substrate; and a semiconductor substrate including a plurality of active elements which are formed on the surface side of the semiconductor substrate; wherein the signal line is physically and electrically connected to an input/output terminal of the active element via a metal bump; and the first grounding conductor portion is physically and electrically connected to a grounding terminal of the active element via another metal bump, such that a plurality of different kinds of functional blocks is provided.

2. A microwave and millimeter wave device according to claim 1, wherein the active elements are arranged in a line so as to have alternating input directions to one another.

3. The micro and millimeter device according to claim 2, wherein there are five active elements.

4. The micro and millimeter device according to claim 1, wherein the active elements are arranged in a line so as to have alternating input and output directions to one another, so that the passive elements for connecting two adjacent active elements is facilitated.

5. The micro and millimeter device according to claim 4 wherein there are five active elements.

6. The micro and millimeter device according to claim 1 wherein there are five active elements.

* * * * *